United States Patent [19]

Hashizume et al.

[11] Patent Number: 5,260,949
[45] Date of Patent: Nov. 9, 1993

[54] SCAN PATH SYSTEM AND AN INTEGRATED CIRCUIT DEVICE USING THE SAME

[75] Inventors: Takeshi Hashizume; Kazuhiro Sakashita, both of Hyogo, Japan

[73] Assignee: Mitsubishi Denki Kabushiki Kaisha, Tokyo, Japan

[21] Appl. No.: 628,688

[22] Filed: Dec. 14, 1990

[30] Foreign Application Priority Data

Dec. 27, 1989 [JP] Japan ............ 1-341064
Nov. 19, 1990 [JP] Japan ............ 2-314545

[51] Int. Cl.$^5$ ............ G01R 31/28
[52] U.S. Cl. ............ 371/22.3
[58] Field of Search ............ 371/22.3, 22.1; 324/158 R

[56] References Cited

U.S. PATENT DOCUMENTS

| | | | |
|---|---|---|---|
| 4,698,588 | 10/1987 | Hwang et al. | 371/22.3 |
| 4,701,921 | 10/1987 | Powell et al. | 371/22.3 |
| 4,799,004 | 1/1989 | Mori | 371/22.3 |
| 4,812,678 | 3/1989 | Abe | 307/443 |
| 4,872,169 | 10/1989 | Whetsel, Jr. | 371/22.3 |
| 4,897,837 | 1/1990 | Ishihara et al. | 371/22.3 |
| 4,914,379 | 4/1990 | Maeno | 371/22.3 |
| 5,054,024 | 10/1991 | Whetsel | 371/22.3 |
| 5,056,093 | 10/1991 | Whetsel | 371/22.3 |
| 5,084,874 | 1/1992 | Whetsel, Jr. | 371/22.3 |
| 5,130,647 | 7/1992 | Sakashita et al. | 324/158 R |
| 5,150,044 | 9/1992 | Hashizume et al. | 324/158 R |

OTHER PUBLICATIONS

R. P. Van Riessen et al, "Designing and Implementing An Architecture With Boundary Scan", IEEE Design & Test, Feb. 1990, pp. 9-19.
K. Sakashita et al, "Cell-Based Test Design Method", 1989 International Test Conference Proceedings, pp. 909-916.

Primary Examiner—Charles E. Atkinson
Attorney, Agent, or Firm—Lowe, Price, LeBlanc & Becker

[57] ABSTRACT

Test data applied serially from a data input terminal 6 is bypassed by a selecting circuit in modules that are not the object of testing and applied to a scan path in modules that are the object of testing. Test data is applied to the control point of the functional module from the scan path, and test result data provided from the observation point of the functional module and fetched by the scan path. The scan path shifts the fetched test result data to provide serially from a data output terminal 7. Each of selecting means 5a-5c operates in response to the selecting data held in the corresponding selecting data holding/propagating circuits 9a-9c. These selecting data holding/propagating circuits 9a-9c shift and hold selecting data applied serially from a data input terminal 10.

53 Claims, 27 Drawing Sheets

|  | MB1 (LOGIC) | MB2 (ROM) | MB3 (RAM) | MC1 (CPU) |
|---|---|---|---|---|
| MAJOR FEATURES | 2 kG | 512w x16b | 256w x8b | 16 bit |
| NUMBER OF TRANSISTORS | 8k | 8K | 16K | 50k |
| NUMBER OF INPUTS | 40 | 10 | 19 | 40 |
| NUMBER OF OUTPUTS | 40 | 32 | 8 | 40 |
| NUMBER OF TEST VECTORS | 2k | 0.5K | 1.25K | 70k |

1k = 1000 , 1K = 1024

SCAN PATH SYSTEM AND AN INTEGRATED CIRCUIT DEVICE USING THE SAME

BACKGROUND OF THE INVENTION

1. Field of the Invention

The present invention relates to integrated circuit devices, and more particularly, to an integrated circuit device propagating data on a shift path previously prepared internally, such as scan designed integrated circuit devices.

2. Description of the Background Art

It is extremely difficult to observe the internal state of an integrated circuit device, particularly one having internal complex functional logics, by performing tests using only primary input/output terminals. Such difficulties are expressed by terms of "observability" and "controllability".

Controllability indicates the difficulty in controlling the internal signals of a circuit. Observability indicates the difficulty in observing the internal state of a circuit.

In order to examine whether there is a defect or not in a certain position inside the circuit, it is necessary to control the input signals applied thereto. It is also necessary to observe precisely the output obtained by the result of a predetermined input. It will be impossible to determine whether there is a fault or not in the circuit if either observability or controllability is lacking.

In an integrated circuit device having complex functional logics, there are many gates between the testing position and the primary I/O terminals. It is therefore extremely difficult to obtain satisfactory observability and controllability. Furthermore, large-scale integrated circuit devices are becoming increasingly complex according to the advance in semiconductor techniques. Meanwhile, the necessity of designing/developing various integrated circuit devices in small quantity and in a short time period is growing. In order to meet these requirements, design methods are introduced such as chip hierarchical design and cell-based method.

Regarding hierarchical design, the elements having a simple structure (for example, a logical gate) is the bottom level design unit. A plurality of design units are assembled to form one functional unit of the upper hierarchy. The functional unit of a further upper level is formed by assembling these plurality of functional units. The functional units of the lower level are taken in the abstract in the upper level, and their detail structure are not visible. By building up a more complex upper level in this manner, the design of an integrated circuit device as a final object is completed.

The cell-based method employs the concept of reusage of prior design features in addition to the hierarchical design. For example, data or the like of chips and circuit blocks having actual satisfactory operational results are stored in a library. A library is a collection of data where designs of integrated circuit devices and relating information are stored and monitored. In designing a new chip, the design data of chips with satisfactory operational results stored in the library are directly reused as one functional unit. This will simplify the design of a more large-scale integrated circuit.

It has become possible to implement individual functional units on one chip, which were formerly separated on a plurality of chips or boards, owing to the advance of semiconductor techniques in the miniaturization of circuits. This allows designing by the aforementioned cell-based method. The design time period is greatly shortened and the quality of the design has improved.

The movement to large-scale integrated circuit devices has increased the difficulty of testing the circuits as mentioned above. Therefore, the so-called testability design has become an important factor. Test execution comprises a plurality of steps such as creation of test data, carrying out the operation of the block under test by test data, output of the test results, and confirmation thereof. In accordance with the increase in scale of the circuit, the time period required for testing has increased, whereby reduction in testing time becomes an important element.

The so-called scan design method is employed to simplify the testing, which will be explained hereinafter. In scan design, shift register latches (referred to as SRL hereinafter) are provided at internal observation points (the location where the output is to be observed) and control points (the location where the input is set) in the integrated circuit. By connecting a plurality of SRLs in series, a shift path (referred to as "scan path" hereinafter) is formed where data can be propagated therethrough.

The desired data is set at the SRL of the control point by externally applying data to the scan path to be propagated serially within the scan path. The stored data in each SRL is applied to the circuit under test. The output is provided to the SRL of each observation point and stored therein. The stored data of the SRL is transmitted again on the scan path serially to be provided externally as a serial signal from the output terminal. Observability and controllability in the profound locations of the integrated circuit device can be obtained by providing such a scan path.

This scan design method handles data in time series. The scan length increases due to the large-scalarization of the integrated circuit device. Accordingly, the testing time will also increase.

FIG. 25 is a graph showing the estimation of the testing time when the scan path length increases. (Takeshi Hashizume et al. "Cell-Based Test Design Method" 1989 International Test Conference Proceedings pp. 909-916). Referring to FIGS. 26 and 27, the chip model 105 of this estimation comprises n model units (MU1) 104 and one model processor (MC1) 106.

One model unit 104 comprises 3 logic blocks (MB1) 101, one 512w (word)×16b (bit) ROM block (MB2) 102, and one 250w×8b RAM block (MB3) 103.

The major features of MB1, MB2, MB3 and MC1 are as shown in FIG. 27. In this test, SRLs are provided only at the input terminal of each circuit block for reducing the overhead (area and propagation delay) of the testing circuit. Accordingly, the scan path length of each block is equal to the number of input terminals of each block (the number of SRLs connected in series).

The number of input terminals of one model unit 104 is 149 (40×3+10+19). The number of inputs of MC1 is 40. One model chip comprises n model units 104 and one model processor 106, as stated before. The scan path of each model unit and model processor within model chip 105 are all connected in series. In other words, there is only one scan path formed in model chip 105. Therefore, the scan path length of this model chip is 149×n+40.

The testing time shown in FIG. 25 is represented in the graph in comparison with the circuit complexity (the number of transistors). The circuit complexity of the chip is $\{(8k+8K+16K)\times n+50K\}$. Both the circuit complexity of the chip and the scan path length are proportional to n. It is considered that the relationship between the scan path length and the testing time is similar to that of the graph in FIG. 25.

It is appreciated from FIG. 25 that the testing time is proportional to the scan path length. In the testing of integrated circuits, it is required that the time for testing and the number of test pins are reduced to shorten the development time period and the inspection time at shipment. To meet these requirements, the method of dividing the scan path and carrying out the input/output of data using a multiplexer (MUX) by single input and output pins has been employed.

Referring to FIG. 28, integrated circuit 1 comprises functional modules 3a, 3b, 3c and a multiplexer 5. The functional module comprises the aforementioned ROM, RAM or processor.

SRLs 4a-4f are connected to the input and output terminals of functional module 3a. Functional module 3a and SRLs 4a-4f form module 2a.

SRLs 4g-4k are connected to the input and output terminals of functional module 3b. Functional module 3b and SRLs 4g-4k form module 2b.

SRLs 4l-4r are connected to the input and output terminals of functional module 3c. Functional module 3c and SRLS 4l-4r form module 2c.

SRLs 4a-4f are connected in series to form one scan path. The input of SRL 4a is connected to scan-in (SI) terminal 6. The output of SRL 4f is connected to MUX 5. In a similar manner, SRLs 4g-4k form one scan path with the input thereof connected to SI terminal 6 and the output thereof connected to MUX 5. SRLs 4l-4r are also connected in series to form one scan path, with the input thereof connected to SI terminal 6 and the output thereof connected to MUX 5.

MUX 5 is provided with selecting signal input terminals 8a and 8b, where the output thereof is provided from scan-out (SO) terminal 7. Selecting signal input terminals 8a and 8b are input terminals applied with selecting signals for selecting one of functional modules 3a, 3b, 3c as the block to be tested. The selecting signal comprises 2 bits since there are 3 selection objects.

Referring to FIG. 28, the operation of integrated circuit 1 at the time of functional testing is described hereinafter. The functional testing of integrated circuit 1 is accomplished by carrying out the functional testing of functional modules 3a-3c individually. Sufficient test pattern data for testing the functions are prepared in advance regarding functional modules 3a-3c.

The functional testing of functional module 3a will be taken as an example. A 2-bit value is set at selecting signal input terminals 8a and 8b for indicating to MUX 5 that the output of SRL 4f is to be provided from SO terminal 7.

Input data for functional testing of functional module 3a is applied in series from SI terminal 6. The input data is propagated on the scan path of SRLs 4a-4f in sequence to be set in the SRL connected to the input terminal of the functional module 3a. This allows the external desired data to be applied to the input terminal of the internal functional module 3a of the integrated circuit.

Functional module 3a is responsive to the input value to provide the result at the output terminal. The output result is stored in the SRL connected to the output terminal of functional module 3a. The data held in SRL is propagated in sequence to the scan path and MUX 5 to be serially provided from SO terminal 7.

The aforementioned operation is carried out for all test patterns of functional module 3a to complete the functional testing of functional module 3a. Similar functional testings are carried out for functional modules 3b and 3c.

Considering the creation of a library, functional module 3a and SRLs 4a-4f for testing functional module 3a are often bundled together to be effectively designed as a new module 2a. The other functional modules 3b and 3c are also often designed as modules 2b and 2c incorporating the scan path for testing.

With reference to FIG. 29, an example applying the conventional scan design of FIG. 28 to the hierarchical design will be explained. An integrated circuit device having such hierarchical testing circuits is disclosed in Japanese Laying-Open No. 62-93672, for example. Referring to FIG. 29, the hierarchical integrated circuit 1b comprises modules 1a, 2d, and 2e, and MUX 5b.

Module 1a is identical to the integrated circuit 1 of FIG. 28. Integrated circuit 1b comprises the integrated circuit 1 of FIG. 28 as one module 1a. A new function of integrated circuit 1b is implemented by arranging module 1a with the other individual modules 2d and 2e on integrated circuit 1b. In FIG. 29, only the scan path and the block under test associated with MUX 5b are shown for convenience of description.

Module 1a further comprises lower level modules 2a, 2b and 2c, and MUX 5a for selecting one of the three modules for testing. Module 2a comprises a functional module not shown, and SRLs 4a-4f connected serially. Each of SRLs 4a-4f is connected to the input/output terminals of the functional module not shown. The input of SRL 4a is connected to SI terminal 6a of module 1a, and the output of SRL 4f is connected to MUX 5a.

In a similar manner, module 2b comprises a functional module not shown and SRLs 4g-4k. Module 2c comprises a functional module not shown and SRLs 4l-4r. SRLs 4g-4k and SRLs 4l-4r are respectively connected in series to form a scan path, with the inputs thereof both connected to SI terminal 6a and the outputs thereof both connected to MUX 5a.

MUX 5a is provided with selecting signal input terminals 8a and 8b, with the output thereof connected to SO terminal 7a. Selecting signal input terminals 8a and 8b are also connected to selecting signal input terminals 8a' and 8b' of integrated circuit 1b. SO terminal 7a of module 1a is connected to MUX 5b of integrated circuit 1b.

Similarly to modules 2a, 2b and 2c, module 2d comprises a functional module not shown, and SRLs 4s-4u connected serially. SRLs 4s-4u form a scan path with the input thereof connected to SI terminal 6b and the output thereof connected to MUX 5b. SRLs 4s-4u are connected to the I/O terminals of the functional module not shown of module 2d.

In a similar manner, module 2e comprises a functional module not shown, and SRLs 4v-4x connected serially. SRLs 4v-4x form a scan path with the input thereof connected to SI terminal 6b and the output thereof connected to MUX 5b.

MUX 5b is provided with selecting signal input terminals 8c and 8d for selecting one of modules 1a, 2d and 2e. The data selected by MUX 5b is provided to SO terminal 7b.

Referring to FIG. 29, the operation in functional testing of each functional module of the hierarchical integrated circuit 1b will be explained. Via selecting signal input terminals 8c and 8d, MUX 5b is externally applied with a selecting signal for selecting one of modules 1a, 2d and 2e.

For example, it is assumed that module 1a is selected by the selecting signal. The output of SO terminal 7a is provided to SO terminal 7b via MUX 5b. Module 1a comprises three lower level modules 2a, 2b, and 2c. One of the three modules must be selected at the time of testing. A selecting signal for specifying this selection of the module is applied to MUX 5a via selecting signal input terminals 8a and 8b.

It is assumed that module 2a is selected, for example. A scan path from SI terminal 6b to SO terminal 7b through module 2a, MUX 5a, and MUX 5b is formed.

With module 2a selected, the test pattern data from SI terminal 6b is set in SRLs 4a-4f. The functional module of module 2a is operated by the test data. The result of the testing is stored in the SRL of 4a-4f connected to the output of the functional module not shown. The output result is again transmitted on the scan path to be provided from SO terminal 7b in series. The testing of module 2a is completed by carrying out functional testing regarding all the test patterns of the functional module of module 2a.

In a similar manner, modules 2b and 2c are each selected by changing the signal applied to selecting signal input terminals 8a' and 8b'. The testing of module 1a is completed by carrying out the testing regarding each module.

After the testing of module 1a is completed, the signal applied to selecting signal input terminals 8c and 8d are changed, whereby either module 2d or 2e is selected as the block to be tested. Similarly to module 1a, testing of either of module 2d or 2e is carried out. In this case, it is not necessary to select the scan path in module 2d, for example, because modules 2d and 2e only have a single scan path.

As said in the foregoing, functional testing of integrated circuit 1b is completed by carrying out testing regarding all modules, including the lower level modules in a module.

In the case where integrated circuit 1b is developed incorporating integrated circuit 1 of FIG. 28 directly as module 1a, the following problems occur.

Hierarchical module 1a has its physical layout determined under a state where signal wiring is allocated for functional testing of each module 2a, 2b and 2c. This design data is stored in a library where the contents can not be modified. The modification of design pattern of module 1a from integrated circuit 1 in incorporating module 1a to integrated circuit 1b is difficult and does not agree with the concept of hierarchical design. It is not basically allowed because the operational characteristics and the like can not be guaranteed after the modification of the pattern.

For example, the design of MUX 5a or selecting signal input terminals 8a and 8b can not be modified in module 1a. This means that the allocation of the module is limited. It is necessary to provide many selecting signal input terminals such as 8a' and 8b' for specifying the selection in the MUX circuit every time an upper level integrated circuit is hierarchically designed. The addition of such terminals will not only complicate the structure of the upper level functional modules, but also decrease the effectiveness of test execution. The number of pins of the chip is also limited, so many pins can not be provided for the purpose of testing.

It is necessary to provide testing circuits considering the hierarchical design in each functional module. FIG. 30 shows such a circuit. The circuit diagram of FIG. 30 is produced by the inventor of the present invention according to the invention disclosed in Japanese Patent Laying-Open No. 61-99875, for example.

Referring to FIG. 30, integrated circuit 1 includes three modules 2l, 2b and 2c.

Module 2a includes functional module 3a, SRLs 4a-4f connected to the I/O terminals of functional module 3a in series to form one scan path, and MUX 5a having one input connected to the input terminal of SRL 4a and the other input connected to the output terminal of SRL 4f, for selectively providing the input from SI terminal 6 and the signal via SRLs 4a-4f, in response to the selecting signal applied from selecting signal input terminal 201.

In a similar manner, module 2b includes functional module 3b, SRLs 4g-4k each connected to the I/O terminals of functional module 3b and connected in series to form one scan path, and MUX 5b having one input connected to the output of MUX 5a and the other input connected to the output of SRL 4k, for selectively providing the signal applied from MUX 5a and the signal applied via SRLs 4g-4k in response to the selecting signal applied from selecting signal input terminal 202.

Module 2c includes functional module 3c, SRLs 4l-4r each connected to the I/O terminals of functional module 3c and connected in series to form one scan path, and MUX 5c having one input connected to the output of MUX 5b and the other input connected to the output of SRL 4r, for selectively providing the signal applied from MUX 5b and the output of SRL 4r to SO terminal 7 in response to the selecting signal applied from selecting signal input terminal 203.

In integrated circuit 1 of FIG. 30, the scan path of each modules 2a-2c and the bypass path bypassing each scan path can be selected by MUXs 5a-5c in response to the selecting signal applied from selecting signal input terminals 201-203. It is possible to determine whether to test or not each module by the signal applied to selecting signal input terminals 201-203. Thus, the testing time can be reduced because the scan path length is shortened.

The integrated circuit with such configuration has the following problems. The selection of each scan path is carried out by the signal applied to selecting signal input terminals 201-203. The number of necessary selecting signal input terminals is equal to the number of scan paths in the chip. The number of pins for applying the selecting signal increases linearly according to the number of functional modules within the chip. It has become actually impossible to create such an integrated circuit regarding large-scale integrated circuits.

As shown in FIG. 31, the approach of providing a decoder 91 to determine as the block under test which of the functional modules of the integrated circuit is to be selected can be taken, for avoiding the aforementioned problem. The testing circuit employing a decoder is disclosed in the aforementioned Japanese Patent Laying-Open No. 62-93672, U.S. Pat. No. 4,701,921, or the like. By providing decoder 91, there is an advantage that the number of pins for selecting the module under test does not have to be significantly increased.

However, such a method requires the provision of test circuit blocks including decoder 91. This imposes a new load of considering the design, allocation, wiring, and the like of the test circuit block for designers in designing the chip. It is also necessary to gather the selecting signal lines in the decoder of the test circuit block. This will reduce layout efficiency due to increase of wiring region and the like.

FIG. 32 shows a schematic diagram of an integrated circuit in hierarchical design, using the integrated circuit provided with a decoder as a functional module. Referring to FIG. 32, integrated circuit 1b includes modules 1a, and 2a-2d. Module 1a further includes lower level modules 2e-2j. Each of modules 2a-2j has a scan path of a structure identical to that of modules 2a-2c of FIG. 31.

Module 1a further includes a decoder 91a for specifying whether or not to select each of modules 2a-2j as the block under test. Each of modules 2e-2j is connected to decoder 91a.

Integrated circuit 1b further includes a decoder 91b for deciding to select or not modules 1a, and 2a-2d as the block under test. Decoder 91a of module 1a, and modules 2a-2d are connected to decoder 91b. Accordingly, wiring for applying selecting signals are gathered in the periphery of decoder 91b. This will lead to a problem that the efficiency of the layout will be lowered according to the increase in scale of the circuit and hence in the wiring region.

Testing circuit techniques that can solve the above mentioned problem is described in U.S. Pat. No. 4,872,169, and in "DESIGNING AND IMPLEMENTING AN ARCHITECTURE WITH BOUNDARY SCAN", IEEE Design & Test of computers, February 1990 pp. 9-19. With the testing circuit techniques described in these articles, the selecting data is propagated by each scan path. Each scan path is provided with registers serially, where the selecting data is held. The selecting data held in each register is provided to each MUX directly or via a latch to control the switching of each MUX. Each MUX is responsive to the applied selecting data to select the output data of the corresponding scan path, or the input data of the corresponding scan path for providing the selected data to the next testing circuit.

In accordance with the above mentioned testing circuit techniques, the number of signal lines and the signal input/output pins can be reduced because the selecting data is propagated through one data propagation path. Furthermore, the cluster of signal wires, as shown in FIG. 32, is prevented. However, the provision of registers for holding selecting data in each scan path on the data propagation path implemented with each scan path will cause wasteful bits at the time of test data propagation to increase the bit length of the test data propagation path. This will lengthen the propagation time of the test data to increase the testing time. Because each of the above mentioned registers is not bypassed by a MUX, each register will function as a wasteful bit even in modules which are not selected as the object of testing. The increase in testing time is not so serious in the case the number of functional modules to be tested is small. However, in the present situation where large scale integrated circuit devices are obtained and many functional modules are mounted on one chip, the increase in testing time of each register is accumulated to become a critical problem.

The design method of hierarchical design or cell-based method becomes a necessity in designing large-scale integrated circuit devices, as mentioned above. It is therefore necessary to allow the design data of functional modules to be used in the design of new integrated circuits without modification, and reducing the load at the time of design for testing or reducing the time for testing. It is also necessary to reduce the required chip area for testing.

SUMMARY OF THE INVENTION

An object of the present invention is to provide an integrated circuit device easy to design, and having satisfactory layout efficiency, allowing the execution of testing with few testing pins and in a short time.

A further object of the present invention is to provide an integrated circuit device that can be designed as a module with a structure including a testing circuit, and that is suitable for hierarchical design without being greatly affected by the structure of the entire integrated circuit, such as the number of modules.

Another object of the present invention is to provide a modularized hierarchical designed integrated circuit device allowing the selective testing of the desired modules in each hierarchy and in a short time.

Another object of the present invention is to provide a modularized hierarchical designed integrated circuit device allowing selective testing of desired modules in each hierarchy, with a testing circuit that does not occupy a large area.

A still further object of the present invention is to provide a modularized integrated circuit device that does not complicate the testing circuit even if the number of modules is increased, and allowing the selective testing of each module in a short time.

An additional object of the present invention is to provide a modularized hierarchical designed integrated circuit device that does not complicate the testing circuit even if the number of hierarchies is increased, and allowing selective testing of each module in a short time.

An integrated circuit device according to the present invention has internally a plurality of control points and observation points, including a first single data input terminal., a first single data output terminal, a second single data input terminal, a second single data output terminal, a plurality of shift register means, a plurality of selecting data holding means, and a plurality of bypass means. Control point data to be provided to a control point is applied serially from the first data input terminal. The observation point data obtained from an observation point is provided serially from the first data output terminal. Selecting data is applied serially from the second data input terminal. Each shift register means is connected in series to each other, inserted between the first data input terminal and the first data output terminal, and coupled respectively to control points and/or observation points. Selecting data holding means is provided for each shift register means, and is connected in series to each other, inserted between the second data input terminal and the second data output terminal, to shift and hold the selecting data applied from the second data input terminal. Bypass means is provided for each shift register means, and is responsive to the selecting data held in each corresponding selecting data holding means, to form a data bypass path for the corresponding shift register means, when the selecting data does not select the corresponding shift register means. When selected by the selecting data, the shift register means shifts the control point data applied from the first data input terminal to provide the same to the corresponding control point, and fetches and shifts the observation point data from the corresponding observation point to provide the same to the first data output terminal.

The scan path system according to the present invention is employed in an integrated circuit device where there are one or more control points and observation points in the internal. The scan path system includes one or more scan path circuits, to propagate the externally applied control point data to the control point, and to propagate the observation point data obtained from the observation point to an external source. Each scan path circuit includes a single data input terminal, a single data output terminal, shift register means, selecting data holding means, and bypass means. The data input terminal is applied in series the control point data and the selecting data. The data output terminal provides in series the observation point data. The shift register means is inserted between the data input terminal and the data output terminal, and has one or more bits, where all bits are coupled to control points/observation points. The selecting data holding means is provided external to the data propagation path formed by shift register means between the data input terminal and the data output terminal. The selecting data holding means fetches and holds the selecting data applied from the data input terminal and shifted by the shifting register means, from the output of an arbitrary bit of the shift register means. The bypass means is responsive to the selecting data held in the selecting data holding means to form a data bypass path with respect to the shift register means, when the selecting data does not select the shift register means. When selected by the selecting data, the shift register means shifts and provides to the control point the control point data applied from the data input terminal, and fetches and shifts the observation point data from the observation point and provides the same to the data output terminal.

Another integrated circuit device according to the present invention has in the internal a plurality of control points and observation points, including a single data input terminal, a single data output terminal, a plurality of shift register means, a plurality of selecting data holding means, and a plurality of bypass means. The selecting data and the control point data to be provided to the control point are serially applied from the data input terminal. The observation point data obtained from the observation point is provided serially from the data output terminal. Each shift register means is connected in series to each other, inserted between the data input terminal and data output terminal, and has one or more bits, where all bits are coupled to control points/observation points. Selecting data holding means is provided for each shift register means, and fetches and holds the selecting data applied from the data input terminal and shifted by each shift register means, from the arbitrary bit of the corresponding shift register means. Bypass means is provided for each shift register means, and is responsive to the selecting data held in the corresponding selecting data holding means to form a data bypass path regarding the corresponding shift register means, when the selecting data does not select the corresponding shift register means. Each selecting data holding means is provided external to the data propagation path formed by each shift register means. When selected by the selecting data, the shift register means provides the control point data applied from the data input terminal to the corresponding control point, and fetches and shifts the observation point data from the corresponding observation point to provide the same to the data output terminal.

In the integrated circuit device according to the present invention, a data bypass path is formed with respect to unnecessary shift register means by each bypass means. This reduces the scan path length. The determination of whether each bypass means forms a bypass path or not with respect to a corresponding shift register means is made by the selecting data held in the selecting data holding means provided for each shift register means. The selecting data is propagated to each selecting data holding means from the second data input terminal via one selecting data propagation path. Even if the internal structure of the integrated circuit device is changed, the number of signal lines for propagating the selecting data and the number of input/output pins are fixed and do not increase. The bypass means and the selecting data holding means are provided for each shift register means. In designing a circuit block hierarchically including each shift register means as one functional module, it is not necessary to modify the design of the circuit block.

In a further integrated circuit device according to the present invention, the selecting data is applied from the data input terminal where control point data is applied, and propagated by each shift register means to each selecting data holding means. Thus, the number of signal lines for propagating the selecting data and the number of input pins can be reduced. Because each selecting data holding means is provided external to the selecting data propagation path formed by each shift register means, each selecting data holding means does not generate wasteful bits at the time of control point data or observation point data propagation, resulting in rapid data propagation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
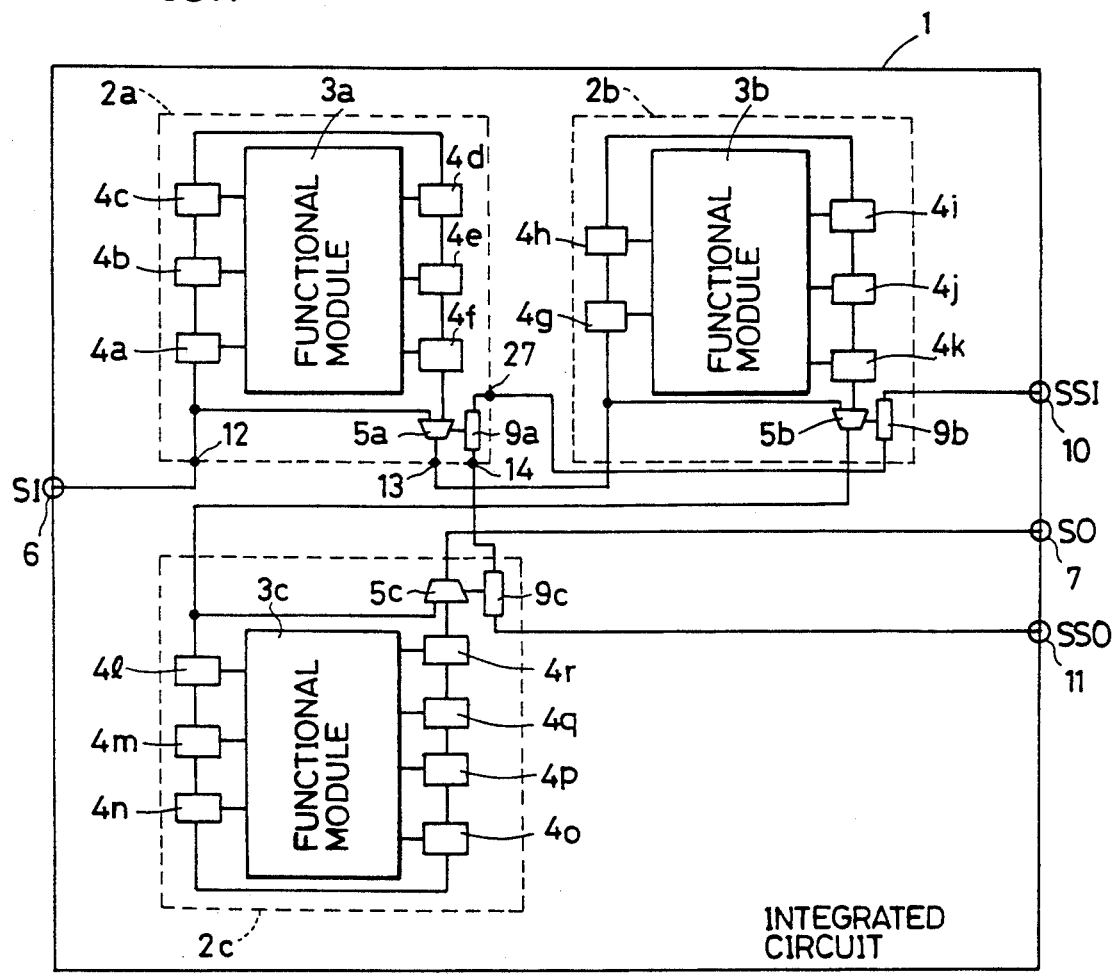
FIG. 1 is a schematic block diagram of an integrated circuit device according to an embodiment of the present invention.

FIG. 1 shows an integrated circuit in accordance with an embodiment of the present invention. The integrated circuit device of FIG. 1 is similar to a conventional integrated circuit of FIG. 30 except for the following points.

Module 2a includes a selecting data holding/propagating circuit 9a for holding/propagating and providing the selecting data determining the selection of the bypass path and scan path by selecting circuit 5a.

In a similar manner, module 2b includes a selecting data holding/propagating circuit 9b to hold the selecting data for determining the selection of the bypass path and the scan path by selecting circuit 5b. Module 2c includes a selecting data holding/propagating circuit 9c to hold the selecting data for specifying the selection of the scan path and the bypass path by selecting circuit 5c.

The input of selecting data holding/propagating circuit 9b is connected to selecting signal input (SSI) terminal 10. The output of selecting data holding/propagating circuit 9b is connected to the input of selecting data holding/propagating circuit 9a. The output of selecting data holding/propagating circuit 9a is connected to the input of selecting data holding/propagating circuit 9c. The output of selecting data holding/propagating circuit 9c is connected to selecting signal output (SSO) terminal 11.

Figure 30:
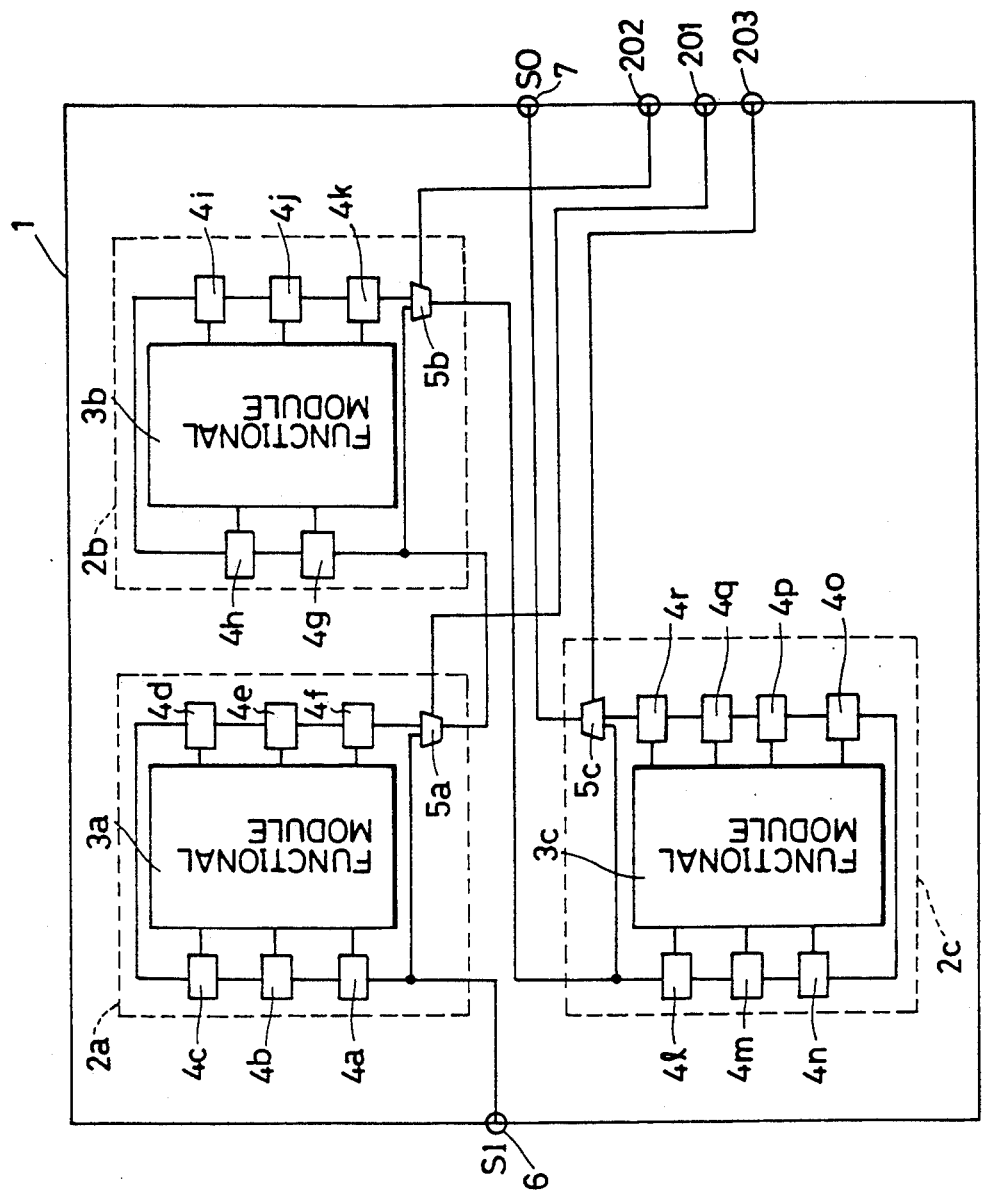
FIGS. 30 and 31 are schematic block diagrams showing an integrated circuit device designed using different testing circuit design methods.
Figure 31:
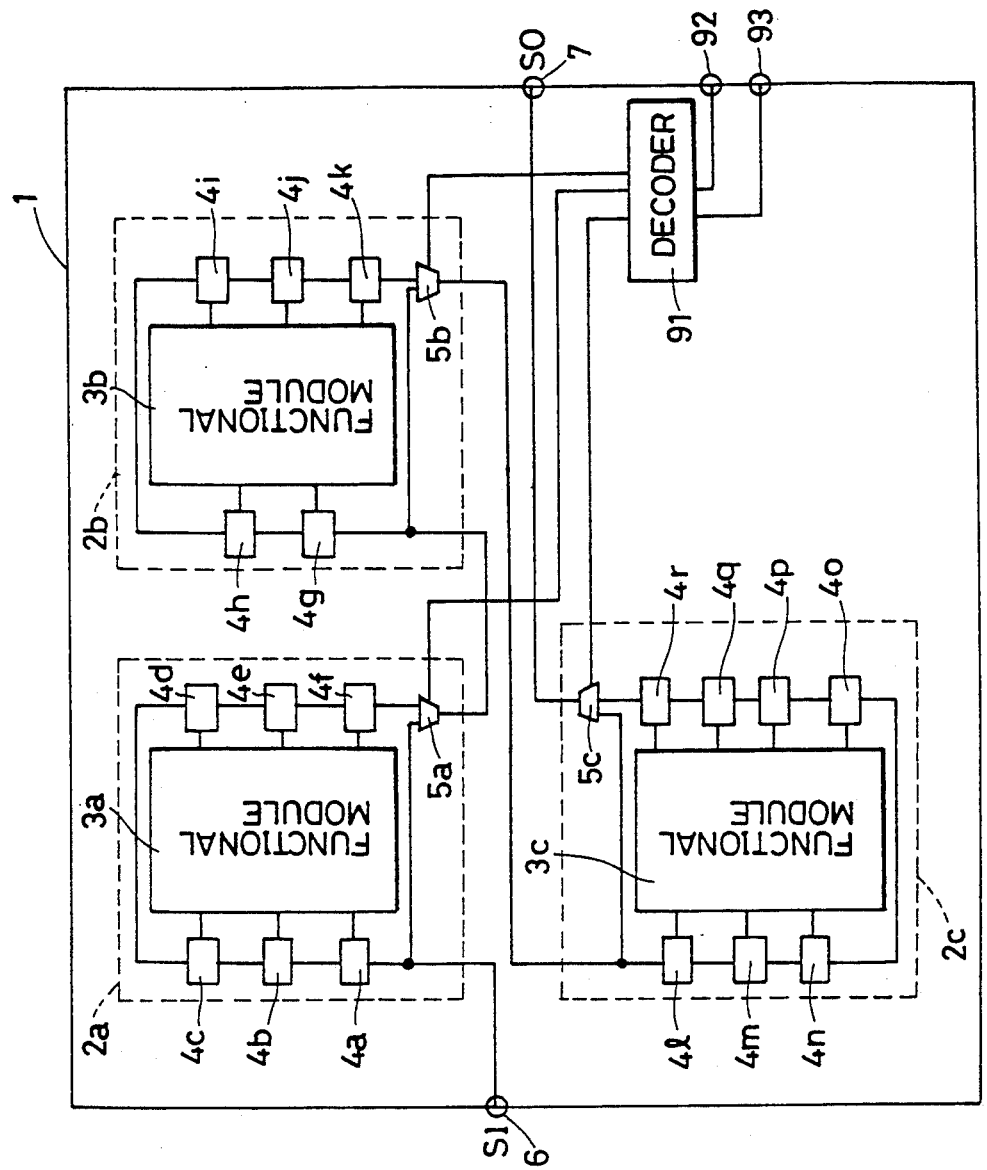

Other points regarding each component of the integrated circuit device of FIG. 1 are identical to those of the integrated circuit device 1 of FIG. 30, wherein identical components are denoted with identical reference numbers. The components that will not be specifically described in the following have functions identical to the corresponding components of FIG. 30.

Figure 2:
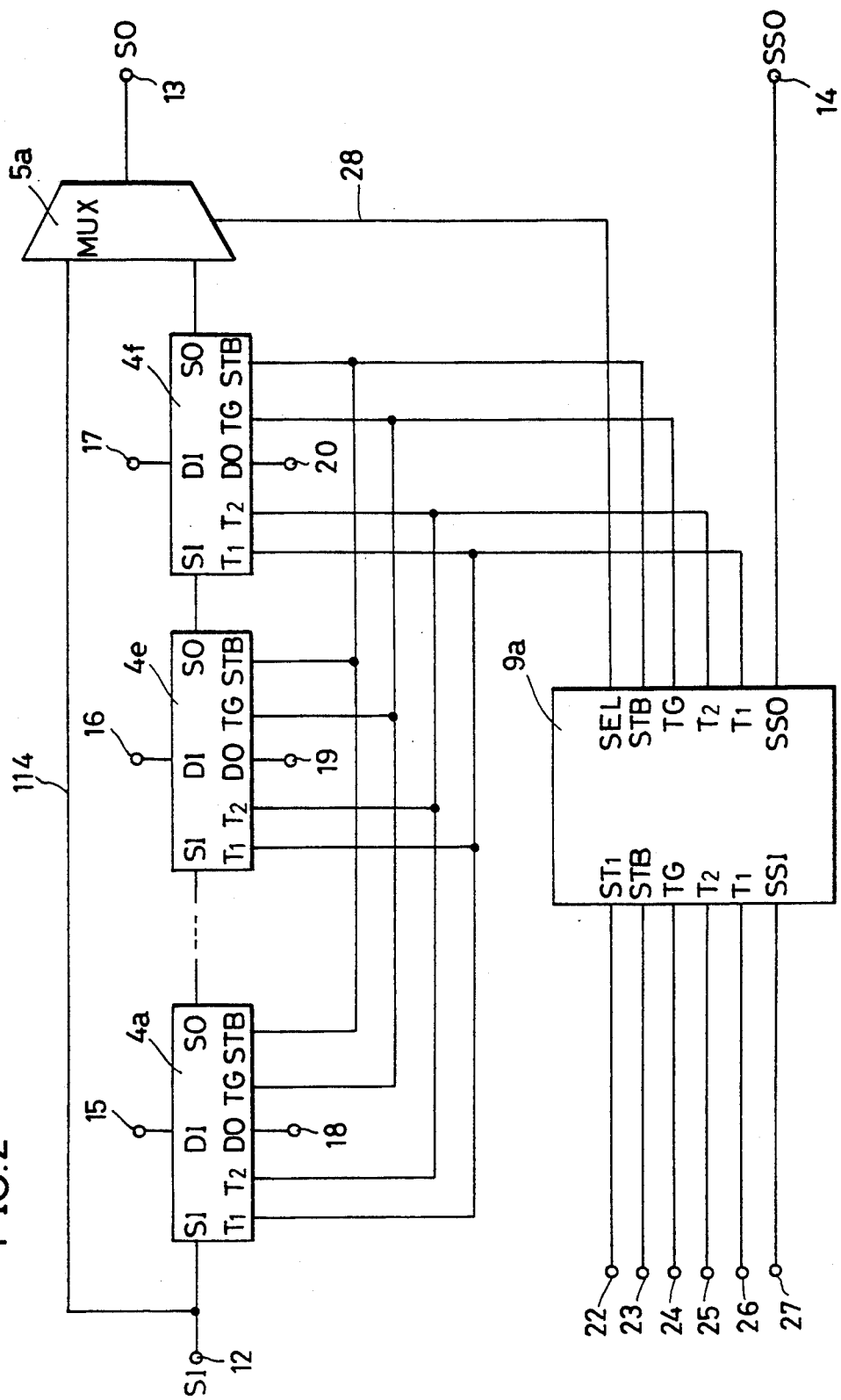
FIG. 2 is a schematic block diagram showing the structure of a testing circuit included in module 2a in the embodiment of FIG. 1.

FIG. 2 is a detail block diagram of a testing circuit formed of a scan path, a bypass line 114, a selecting circuit (MUX) 5a, and a selecting data holding/propagating circuit 9a of module 2a of FIG. 1.

Referring to FIG. 2, the testing circuit of module 2a includes SRLs 4a–4f connected in series with each other to form a scan path, bypass line 114 provided in parallel to the scan path, selecting data holding/propagating circuit 9a for holding and propagating selecting data for selecting either bypass line 114 or the scan path, and MUX 5a having one input connected to the output of the scan path and the other input connected to bypass line 114, responsive to the selecting signal applied from selecting data holding/propagating circuit 9a for selecting either the output of the scan path or the output of bypass line 114 and providing the same to SO terminal 13.

The input terminal SI of SRL 4a is connected to scan path input (SI) terminal 12. Bypass line 114 is also connected to SI terminal 12. SRL 4a includes normal data input/output terminals 15 and 18. In a similar manner, SRLs 4e and 4f each have normal data I/O terminals 16, 19, 17 and 20, respectively. Normal data I/O terminals 15-20 are connected to the input or output terminals of module main body 3a.

Figures 3, 4:
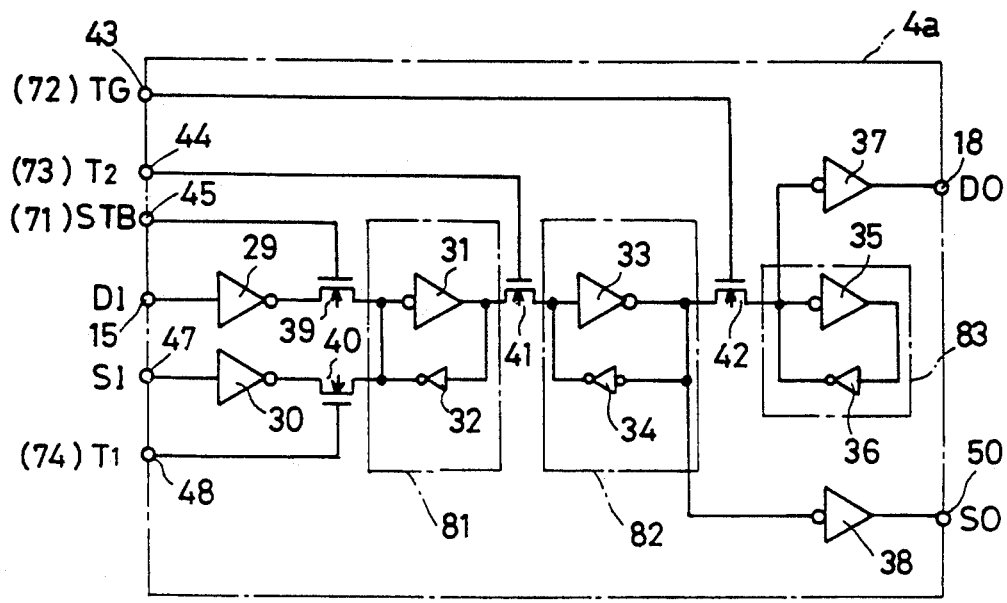
FIG. 3 is a circuit diagram of an example of a structure of a shift register latch.
FIG. 4 is a circuit diagram showing a detail structure of a selecting data holding/propagating circuit 9a of FIG. 1.

Referring to FIG. 3, SRL 4a includes an inverter 29 connected to data input (DI) terminal 15, a transmission gate 39 of a n channel transistor having the gate connected to STB terminal 45 where the strobe signal (STB) for specifying the storing of data from DI terminal 15 into SRL 4a is applied, with the input connected to the output of inverter 29, an inverter 30 having the input connected to SI terminal 47, a transmission gate 40 of a n channel transistor having the input connected to the output of inverter 30 and the gate connected to T1 terminal 48 where clock signal T1 is applied, and a latch circuit 81 connected to the outputs of transmission gate 39 and transmission gate 40 for latching data applied from DI terminal 15.

SRL 4a further includes transmission gate 41 of a n channel transistor having the input connected to the output of latch circuit 81 and the gate connected to T2 terminal 44 where clock signal T2 is applied, a latch circuit 82 connected to the output of transmission gate 41, a transmission gate 42 of a n channel transistor having the input connected to the output of latch circuit 82 and the gate connected to timing signal (TG) terminal 43, a latch circuit 83 connected to the output of transmission gate 42, an inverter 37 connected to the output of transmission gate 42 and having the output connected to DO terminal 18, and an inverter 38 having the input connected to the output of latch circuit 82 and the output connected to SO terminal 50.

Latch circuit 81 includes an inverter 31 having the input connected to the outputs of transmission gates 39 and 40 and the output connected to the input of transmission gate 41, and an inverter 32 of low handling capability having the input connected to the output of inverter 31 and the output connected to the input of inverter 31.

Latch circuit 82 includes an inverter 33 having the input connected to the output of transmission gate 41 and the output connected to the input of transmission gate 42, and an inverter 34 of low handling capability having the input connected to the output of inverter 33 and the output connected to the input of inverter 33. The input of inverter 38 is connected to the output of inverter 33.

Latch circuit 83 includes an inverter 35 having the input connected to the output of transmission gate 42, and an inverter 36 of low handling capability having the input connected to the output of inverter 35 and the output connected to the input of inverter 35.

Other SRLs 4b–4f also have a structure similar to that of SRL 4a.

Referring to FIG. 4, selecting data holding/propagating circuit 9a includes a transmission gate 63 of a n channel transistor having the input connected to selecting signal input (SSI) terminal 69 and the gate connected to selecting signal shift clock input (ST1) terminal 68, a latch circuit 84 connected to the output of transmission gate 63, a transmission gate 70 of a n channel transistor having the input connected to the output of latch circuit 84 and the gate connected to T2 terminal 66, a latch circuit 85 having the input connected to the output of transmission gate 70, and a control signal gate circuit 86 connected to STB terminal 64, TG terminal 65, T2 terminal 66, T1 terminal 67, and to the output of latch circuit 85.

Latch circuit 84 includes an inverter 59 having the input connected to the output of transmission gate 63 and the output connected to the input of transmission gate 70, and an inverter 60 of low handling capability having the input connected to the output of inverter 59 and the output connected to the input of inverter 59. Latch circuit 84 is provided for the purpose of latching the selecting signal applied from SSI terminal 69.

Latch circuit 85 includes an inverter 61 having the input connected to the output of transmission gate 70 and the output connected to SSO terminal 75 and selecting signal output (SEL) terminal 76, and an inverter 62 of low handling capability having the input connected to the output of inverter 61 and the output connected to the input of inverter 61.

Control signal gate circuit 86 includes a NAND gate 51 having one input connected to STB terminal 64 and the other connected to the output of inverter 61, a NAND gate 52 having one input connected to TG terminal 65 and the other input connected to the output of inverter 61, a NAND gate 53 having one input connected to T2 terminal 66 and the other input connected to the output of inverter 61, a NAND gate 54 having one input connected to T1 terminal 67 and the other input connected to the output of inverter 61, and inverters 55, 56, 57 and 58 having the inputs connected to NAND gates 51, 52, 53, and 54 and the outputs connected to STB terminal 71, TG terminal 72, T2 terminal 73, and T1 terminal 74, respectively.

NAND gate 51 and inverter 55, NAND gate 52 and inverter 56, NAND gate 53 and inverter 57, and NAND gate 54 and inverter 58 respectively form an AND gate.

Referring to FIGS. 2 and 4, STB terminal 64 is connected to control signal input terminal 23, TG terminal 65 to control signal input terminal 24, T2 terminal 66 to control signal input terminal 25, and T1 terminal 67 to control signal input terminal 26.

The output of control signal gate circuit 86 is connected to the input terminal of the SRL. For example, STB terminal 71 is connected to STB terminal 45 of SRL 4a, TG terminal 72 to TG terminal 43, T2 terminal 73 to T2 terminal 44, and T1 terminal 74 to T1 terminal 48.

Control signal gate circuit 86 serves as an isolation gate so as to propagate or not propagate the strobe signal, the timing signal, non-overlapping two-phase clock signals T1 and T2 applied from control signal input terminals 23-26 to SRL 4a in response to the output of latch circuit 85.

Similarly to SRL 4a, SRLs 4b–4s are also connected to selecting data holding/propagating circuit 9a.

The operation of an integrated circuit of the present embodiment will be explained with reference to FIGS. 1-6.

The testing circuit of this integrated circuit has three operational modes; a scan path selecting mode for deciding which scan path to select; a functional module test mode for testing the functional module by the selected scan path; and a normal operational mode for operating the integrated circuit device under the normal function. Details of each operational mode will be explained in order.

(1) Scan Path Selecting Mode

The scan path selecting data is propagated serially from SSI terminal 10 on the scan path selecting data propagation path constituted by selecting data holding/propagating circuits 9b, 9a, and 9c.

Referring to FIG. 4, selecting data holding/propagating circuit 9a, for example, operates as in the following manner. The scan path selecting data is applied to selecting data holding/propagating circuit 9a from SSI terminal 69. Transmission gate 63 opens in response to clock signal ST1 applied from ST1 terminal 68. This causes the scan path selecting data to be written into latch circuit 84. Then clock signal T2 non-overlapping with clock signal ST1 is applied from T2 terminal 66 to open transmission gate 70. The data held in latch circuit 84 is stored in latch circuit 85.

The scan path selecting data stored in latch circuit 85 is provided to the next selecting data holding/propagating circuit 9c from SSO terminal 75. Accordingly, the scan path selecting data is propagated on the scan path selecting signal line serially by non-overlapping two-phase clock signals ST1 and T2.

If clock signal T1 is fixed to logical low (referred to as "L" level hereinafter), all shift paths except the scan path selecting signal line do not operate. Referring to FIG. 3, transmission gate 40 is always closed if the clock signal applied from T1 terminal 48 is always at the L level. The path from SI terminal 47 to SO terminal 50 is not conductive.

By propagating the scan path selecting data serially on the selecting data holding/propagating circuits, the desired selecting data can be set in each selecting data holding/propagating circuit. This operation is shown as the "selecting data shift" cycle of FIG. 6.

The selecting data is held in latch circuit 85 of selecting data holding/propagating circuit 9a, for example. To be more specific, the selecting data is held as the output potential of inverter 61. The output of inverter 61 is applied to MUX 5a via SEL terminal 76.

If the data held in latch circuit 85 is logical high (referred to as "H" level hereinafter), MUX 5a provides the output of the scan path, i.e. the output of SRL 4f to SO terminal 13. If the output of latch circuit 85 is at the L level, MUX 5a selects the output of bypass line 114 and provides the same to SO terminal 13.

If the output of latch circuit 85 is at the H level, strobe signal STB, timing signal TG, and non-overlapping two-phase clock signals T1 and T2 are applied to control signal gate circuit 86, whereby the same are provided to each of SRLs 4a-4f. If the selecting data held in latch circuit 85 is at the L level, control signal gate circuit 86 does not propagate the strobe signal and the like to SRLs 4a-4f. In this case, SRLs 4a-4f do not operate in the test mode that will be explained later on.

(2) Functional Module Test Mode

The cases where functional module 3a of FIG. 1, for example, is tested and not test will be explained hereinafter.

(a) When functional module 3a is not selected as the object of testing

The data set at latch circuit 85 is at a L level. Accordingly, the selecting signal provided from SEL terminal 76 to MUX 5a is at the L level. MUX 5a selects the output of bypass line 114 to provide the same to SO terminal 13. Data applied from SI terminal 12 is directly provided to SO terminal 13.

Because the output of latch circuit 85 is at the L level, control signal gate circuit 86 does not propagate any of the strobe signal, timing signal and clock signals T1 and T2 to SRLs 4a-4f. None of SRLs 4a-4f will operate, and the input and output states of functional module 3a maintain the same states.

This prevents the application of unexpected data to a circuit block other than the block under test. It will also be possible to hold the power consumption of other circuit blocks to 0 by bringing the blocks not under test to the non-selected state in measuring the power consumption of a certain circuit block only.

(b) When functional module 3a is selected as the object of testing

Latch circuit 85 has a selecting data of the H level set therein. Selecting data holding/propagating circuit 9a provides an H level selecting signal to MUX 5a via SEL terminal 76. MUX 5a is responsive to the selecting signal to select the output of the scan path and provides the same to SO terminal 13.

Because the output of latch circuit 85 is at the H level, control signal gate circuit 86 is at an open state. The strobe signal, timing signal, clock signals T1 and T2 are applied to SRLs 4a-4f via gate circuit 86.

Referring to FIG. 3, test data provided from SI terminal 12 (FIG. 2) is applied to inverter 30 of SRL 4a, for example, via SI terminal 47. The H level of clock signal T1 causes transmission gate 40 to open. Then, the test data is stored in latch circuit 81.

Clock signal T2 is applied to the gate of transmission gate 41 from T2 terminal 44 to open transmission gate 41. The data held in latch circuit 81 is propagated to latch circuit 82. The output of latch circuit 82 is provided to the succeeding SRL 4b via inverter 38 and SO terminal 50.

By applying clock signals T1 and T2 to SRL 4a alternately, test data is propagated to the succeeding circuit via SI terminal 47, latch circuits 81 and 82, and SO terminal 50. Thus, test data is propagated serially on the scan path constituted by SRLs 4a-4f.

The desired test data is set in each of SRLs 4a-4f by sequentially applying test data from SI terminal 12 on the scan path. The test data is held in latch circuit 82 as the output potential of inverter 33.

Figure 5:
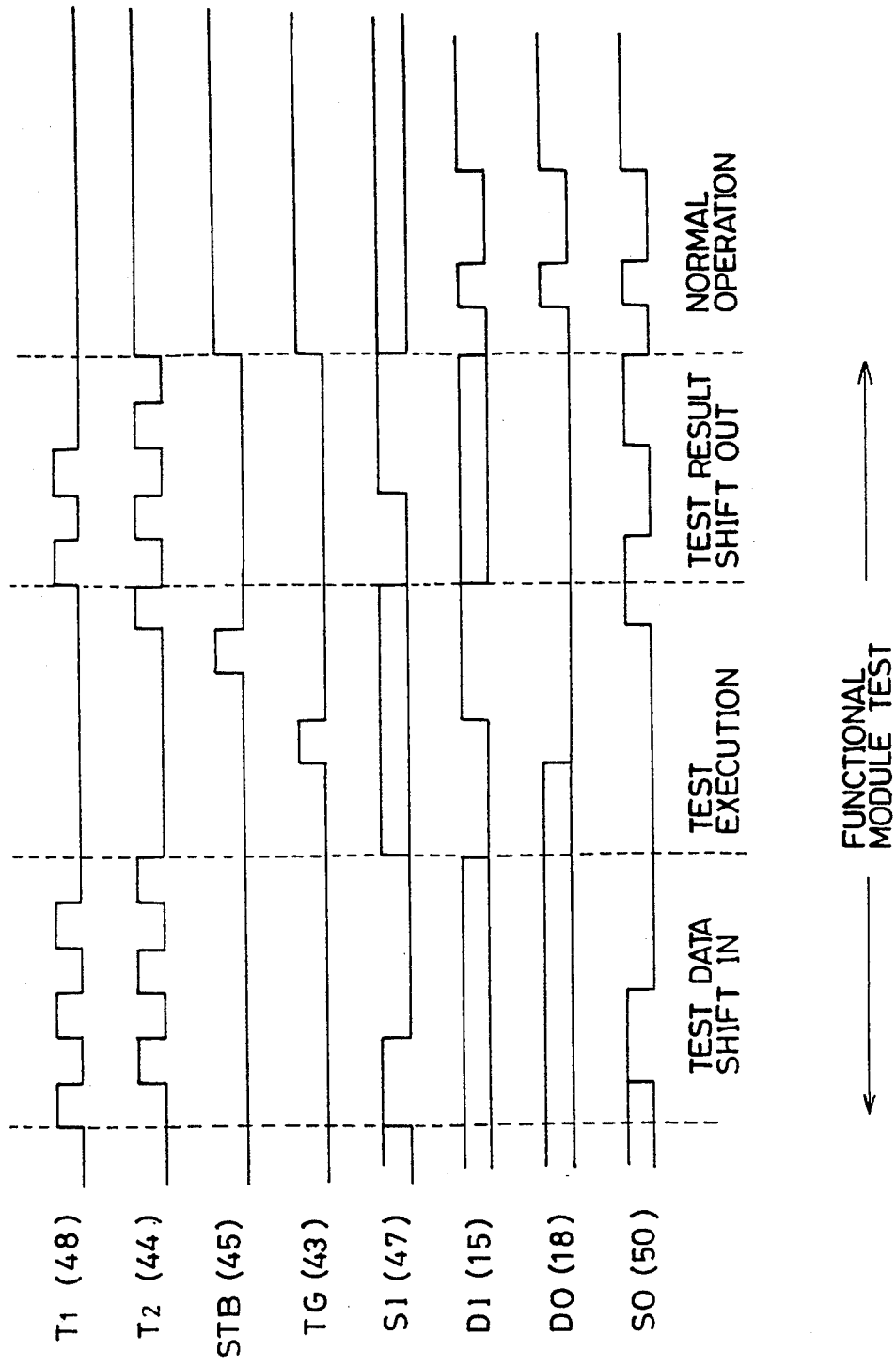
FIG. 5 is a timing chart showing the operation of a shift register latch in the embodiment of FIG. 1.

The aforementioned operation is shown in FIG. 5 as the "test data shift in" cycle.

Next, the timing signal is applied to transmission gate 42 via TG terminal 43. The data held in latch circuit 82 is propagated to latch circuit 83 to be inverted at inverter 37 and provided from DO terminal 18. DO terminal 18 is connected to the input terminal of functional module 3a (FIG. 1) to apply test data to functional module 3a.

Functional module 3a operates in response to the test data applied from the input terminal to provide the results to the output terminal. The output terminal of functional module 3a is connected to DI terminal 15 of SRL 4a, for example.

As shown in the "test execution" cycle of FIG. 5, the strobe signal specifying the storing of data is applied to transmission gate 39 of SRL 4a from STB terminal 45, after the timing signal is returned to a L level. Transmission gate 39 is opened, whereby data applied from DI terminal 15 is held in latch circuit 81. Clock signal T1 is held at the L level during this period. Latch circuit 81 holds the output data of functional module 3a. Then, the strobe signal is returned to the L level.

Clock signal T2 is applied to transmission gate 41 from T2 terminal 44 to open transmission gate 41. The data held in latch circuit 81 is applied to latch circuit 82. Then, non-overlapping two-phase clock signals T1 and T2 are applied to the gates of transmission gates 40 and 41, respectively. In response, the data stored in latch circuit 82 is provided to the succeeding SRL 4b from SO terminal 50. Similarly to the operation at the time of the aforementioned test data shift in, each of SRLs 4a-4f sequentially output the data from SO terminal applied from SI terminal. Thus, data of the test result held in each of SRLs 4a-4f are provided serially from SRL 4f to MUX 5a.

Referring to FIG. 2, MUX 5a is set so as to provide the data of the scan path side, as mentioned above. The data of the test results are therefore provided to SO terminal 13. In other words, when testing of a desired functional module is carried out according to the test data applied from SI terminal 6 in integrated circuit 1 (FIG. 1), the test results cross the scan path to be provided serially from SO terminal 7. The test results can be identified by collating the output of SO terminal 37 with a previously prepared data.

The aforementioned cycle is shown in FIG. 5 as the "test result shift out" cycle.

These operations are continued until all the test patterns of functional module 3a are completed.

(c) If the testing of functional module 3a has ended and it is necessary to test other functional modules, the operations of (a) and (b) will be repeated.

(d) On the termination of testing, integrated circuit 1 must be returned to the normal operational mode. It is therefore necessary to set the required data at each of selecting data holding/propagating circuits 9a-9c. This operation is carried out by serially propagating data specifying the normal operation from SSI terminal 10 on the scan path selecting signal propagation path. This operation is identical to that of the aforementioned "selecting data shift in", except that all scan paths are set to the selected state due to the reasons which will be explained later on.

Figure 6:
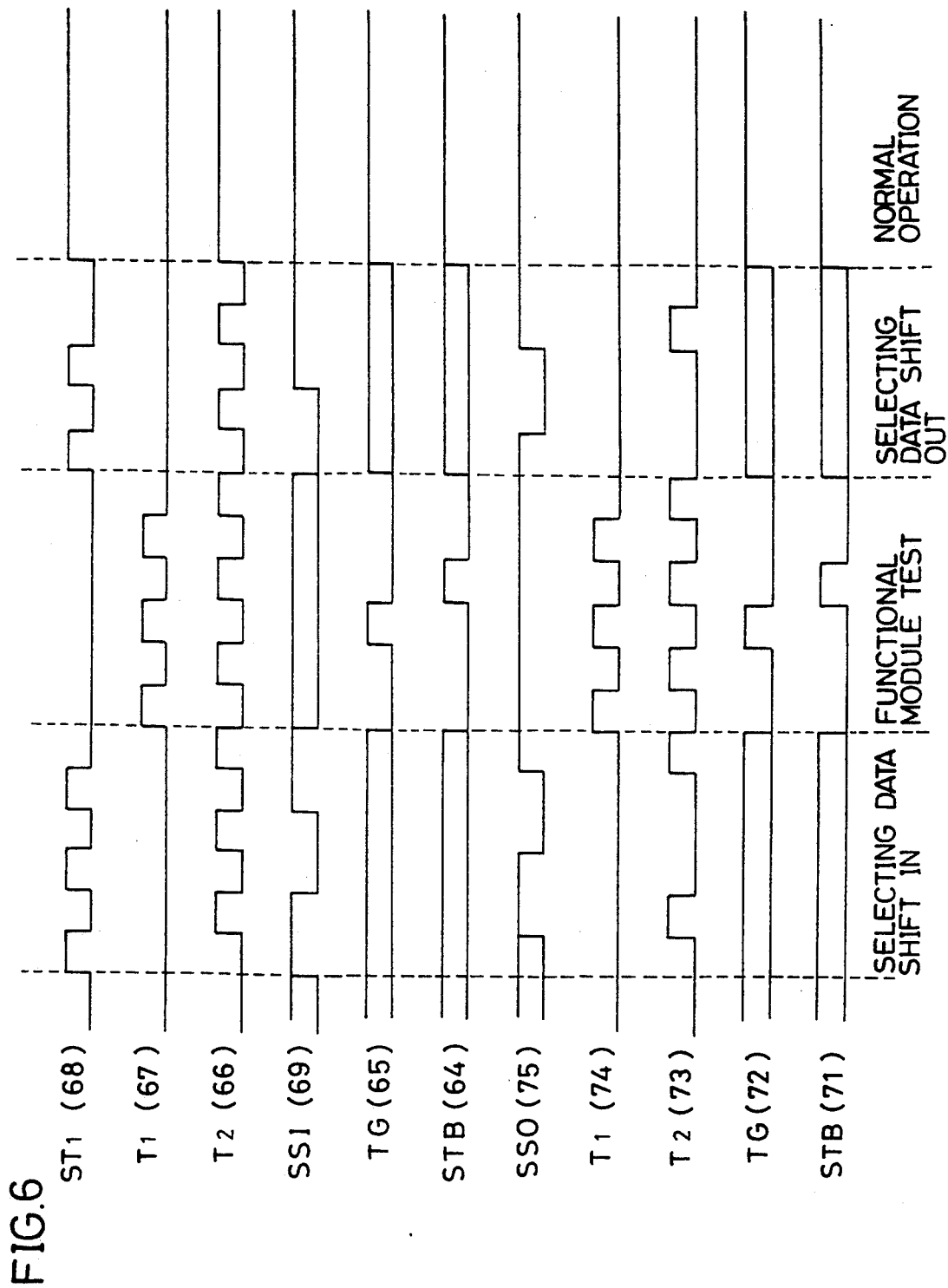
FIG. 6 is a timing chart showing the operation of the selecting data holding/propagating circuit in the embodiment of FIG. 1.

The aforementioned operation is shown in FIG. 6 as the "selecting data shift out" cycle.

(3) Normal Operational Mode

Referring to FIG. 3, SRL 4a, for example, is inserted between DI terminal 15 and DO terminal 18. DI terminal 15 is connected to the output of the functional module preceding functional module 3a. DO terminal 18 is connected to the input terminal of functional module 3a.

During normal operation, each of the SRLs must not affect the data flow between each functional module. It is required that SRL 4a operates as a simple non-inverting driver allowing unrestricted transmission of data from DI terminal 15 to DO terminal 18. STB terminal 45 and T2 terminal 44 both must be fixed at the H level for this purpose. Therefore, it is necessary that control signal gate circuit 86 is opened and strobe signal STB and clock signal T2 are applied to SRL 4a. The output of latch circuit 85 must be at the H level. Therefore, it is required that all selecting data holding/propagating circuits 9a-9c are set to the selected state.

After the signal indicating the selected state is set to all selecting data holding/propagating circuits, the signals applied to each of selecting data holding/propagating circuits will be controlled as in the following manner. Referring to FIG. 4, STB terminal 64, TG terminal 65, T2 terminal 66, ST1 terminal 68, and SSI terminal 69 are all fixed to the H level. T1 terminal 67 is fixed to a L level. This causes the strobe signal, the timing signal, clock signals T1 and T2 to be propagated to SRL 4a.

Referring to FIG. 3, transmission gate 40 is closed because T1 terminal 48 is fixed to the L level. Transmission gates 39, 41 and 42 are all opened because TG terminal 43, T2 terminal 44, STB terminal 45 are all fixed to the H level. Accordingly, unrestricted data propagation between DI terminal 15 to DO terminal 18 is allowed in SRL 4a.

There are four inverters 29, 31, 33, and 37 between DI terminal 15 and DO terminal 18. Data applied to DI terminal 15 is inverted four times to be provided to DO terminal 18, which is a value equal to the former applied value. That is to say, SRL 4a operates as a non-inverting driver.

All scan paths are selected, and all SRLs operate in a manner identical to the aforementioned SRL 4a. The transmission of data between each module will not be blocked. Integrated circuit 1 can carry out the normal operations without any inconvenience.

Figure 7:
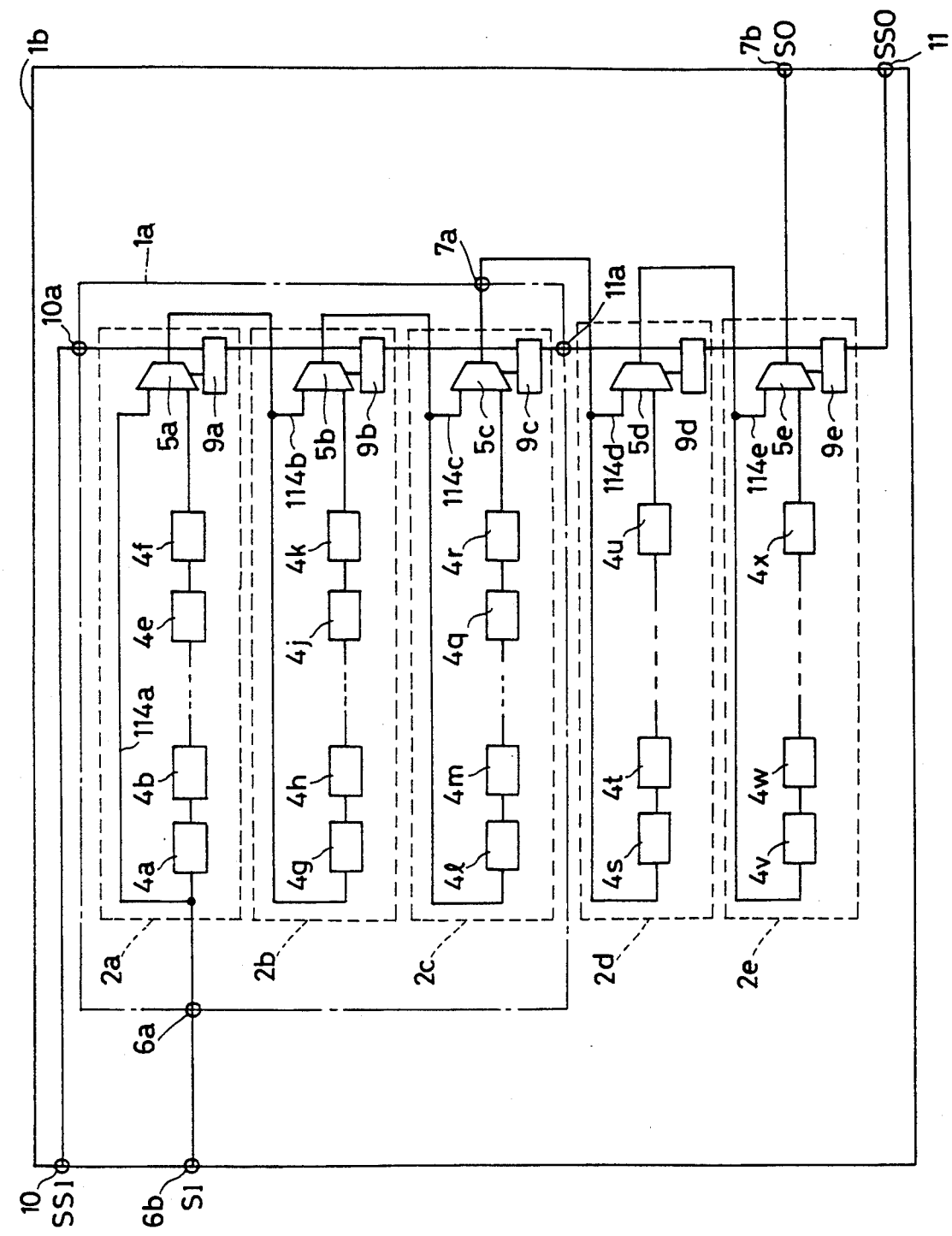
FIG. 7 is a schematic block diagram of an integrated circuit where the testing circuit technique of the embodiment of FIG. 1 is applied in hierarchical design.

FIG. 7 is a schematic block diagram of the integrated circuit where the inventive testing circuit technique of FIG. 1 is applied to the hierarchical design. For the sake of simplicity, only the scan path and the testing circuit by the selecting circuit associated with the present invention are shown as the structure elements of each modules in FIG. 7.

Integrated circuit 1b includes modules 1a, 2d, and 2e. Module 1a further includes lower level modules 2a, 2b, and 2c.

Module 2a includes SRLs 4a-4f connected in series to form a scan path, bypass line 114a provided in parallel to the scan path, MUX 5a having the inputs connected to the outputs of bypass line 114a and SRL 4f, and selecting data holding/propagating circuit 9a connected to MUX 5a for specifying which of the outputs of the scan path or bypass line 114 is to be selected by MUX 5a.

In a similar manner, module 2b includes SRLs 4g-4k connected in series to form a scan path, bypass line 114b, MUX 5b having the two inputs connected to the outputs of bypass line 114b and the scan path, and selecting data holding/propagating circuit 9b connected to MUX 5b for specifying the selection of the output data of MUX 5b.

Module 2c includes SRLs 4l-4r connected in series to form a scan path, bypass line 114c, MUX 5c having the two inputs connected to the outputs of bypass line 114c and the scan path, and selecting data holding/propagating circuit 9c connected to MUX 5c for specifying the selection of the output of MUX 5c.

Module 1a is provided with SSI terminal 10a. Selecting data holding/propagating circuits 9a, 9b and 9c are connected in series between SSI terminal 10a and SSO terminal 11a.

Module 1a further includes SI terminal 6a and SO terminal 7a. The input of SRL 4a is connected to SI terminal 6a. The input of bypass line 114a is connected to SI terminal 6a. The output of MUX 5a is connected to the input of SRL 4g of module 2b. The output of MUX 5a is also connected to the input of bypass line 114b.

The output of MUX 5b is connected to the input of SRL 4l of module 2c. The output of MUX 5b is also connected to the input of bypass line 114c. The output of MUX 5c is connected to SO terminal 7a.

Module 2d includes SRLs 4s-4u connected in series to form a scan path, bypass line 114d connected to the output 7a of functional module 1a, MUX 5d having the two inputs connected to the outputs of bypass line 114d and SRL 4u for selecting and providing either of the outputs, and selecting data holding/propagating circuit 9d connected to SSO terminal 11a of module 1a and MUX 5d for specifying the selection of data by MUX 5d. The input of SRL 4s is connected to SO terminal 7a of module 1a.

Module 2e includes SRLs 4v-4x connected in series to form a scan path, bypass line 114e connected to the output of MUX 5d of module 2d, MUX 5e having the inputs connected to the outputs of bypass line 114e and SRL 4x to select and provide either of the outputs of bypass line 114e or SRL 4x, and selecting data holding/propagating circuit 9e connected to the output of selecting data holding/propagating circuit 9d of module 2d and MUX 5e for specifying the selection of the data by MUX 5e. The input of SRL 4v is connected to the output of MUX 5d of module 2d.

Integrated circuit 1b includes SSI terminal 10, SI terminal 6b, SO terminal 7b, and SSO terminal 11. SSI terminal 10a of module 1a is connected to SSI terminal 10 of integrated circuit 1b. SI terminal 6a of module 1a is connected to SI terminal 6b of integrated circuit 1b. The output of MUX 5e of module 2e is connected to SO terminal 7b. The output of selecting data holding/propagating circuit 9e is connected to SSO terminal 11.

From SSI terminal 10 to SSO terminal 11, one scan path selecting signal line is formed constituted by selecting data holding/propagating circuits 9a–9e. From SI terminal 6a of module 1a to SO terminal 7a, a scan path is formed by SRLs 4a–4r.

One scan path is formed between SI terminal 6b to SO terminal 7b in integrated circuit 1b, implemented by serially connected scan paths of module 1a, module 2d, and module 2e.

The scan paths of each of modules 2a–2e are provided with bypass lines 114a–114e, respectively. The output of the scan path and the output of the bypass line is selected by MUXs 5a–5e. The selection of the signal line by the MUX is specified by selecting data holding/propagating circuits 9a–9e.

The feature of this integrated circuit 1b lies in all connected by one connection line. Another feature is that the structure of the three bottom level modules 2a–2c of the lower level module 1a is identical to that where module 1a is designed as a sole integrated circuit. Similarly, the structures of bottom level modules 2a–2c are identical to that where each are designed solely, whereby no modification is required to the structure in the hierarchical design.

It is appreciated from FIG. 7 that there is only the necessity of providing MUXs and selecting data holding/propagating circuits only in the bottom level modules. It is not necessary to introduce new structure elements in designing the upper level modules. Each selecting data holding/propagating circuit is connected by a single connection line, eliminating the need of complicated wiring. This will allow improvement in layout efficiency in comparison with hierarchical design of conventional integrated circuits.

Figure 8:
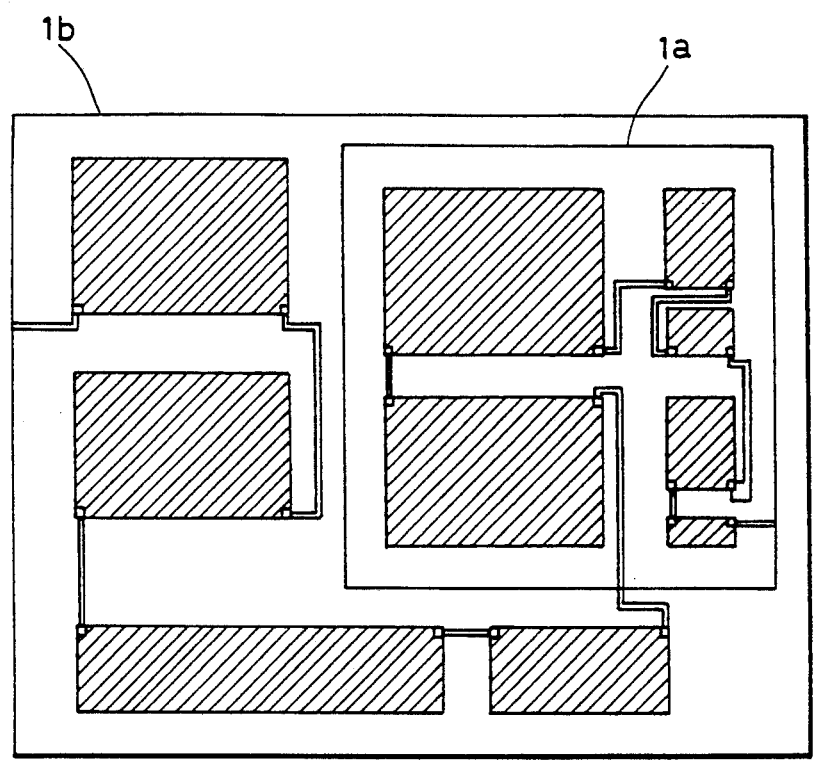
FIG. 8 is a schematic plan view of an example of an integrated circuit device designed using the hierarchical design techniques of FIG. 7.
Figure 32:
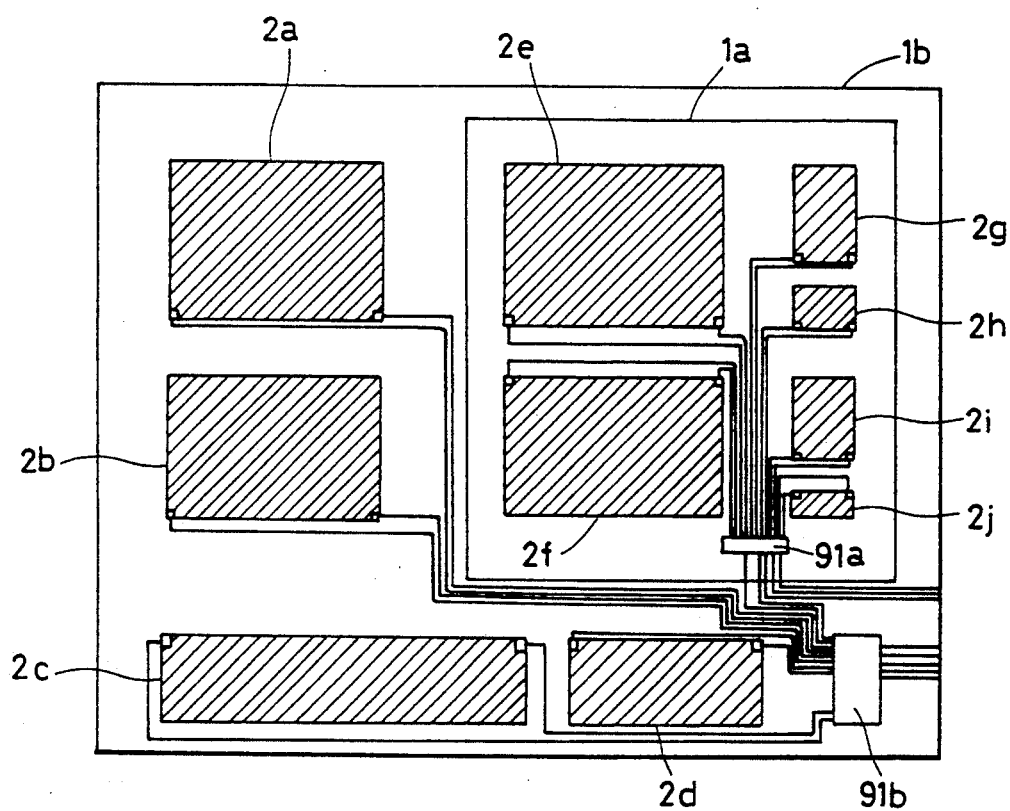
FIG. 32 is a schematic plan view of an integrated circuit device using a conventional testing circuit and designed by hierarchical design.

FIG. 8 is a plan view of an integrated circuit where hierarchical design is carried out using the integrated circuit device in accordance with the present invention. The advantages of the integrated circuit of the present invention will become obvious in comparison with FIG. 32 described in the foregoing.

Even in the case where the lower level integrated circuit is incorporated as module 1a, and several other modules are arranged, the wiring required for testing in integrated circuit 1b is only that which connects each functional module serially. Accordingly, the wiring will not be gathered at one location, or the number of pins for testing are not unreasonably increased, as in the case of integrated circuit of FIG. 32. The design of integrated circuits can be carried out much easier compared to conventional techniques, not only in the design of sole integrated circuits, but also in hierarchical design.

Although the embodiment of the inventive integrated circuit has been described as in above in detail, the present invention is not limited to the aforementioned embodiment. For example, the structures of the SRLs and selecting data holding/propagating circuits are not limited to those in the aforementioned embodiment, and various types can be used.

Figure 9:
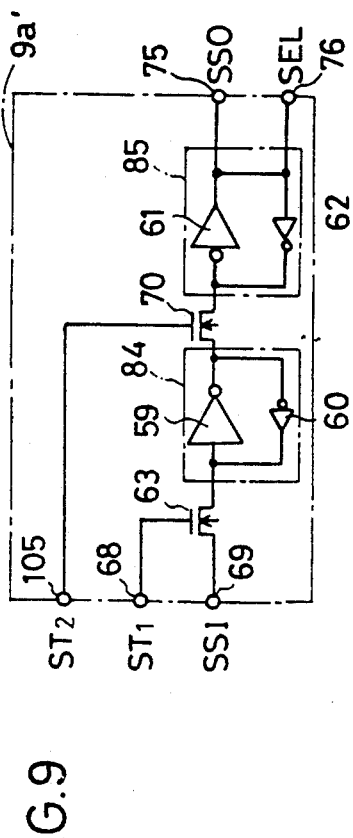
FIG. 9 is a circuit diagram showing the structure of the selecting data holding/propagating circuit used in the integrated circuit device of another embodiment of the present invention.
Figure 10:
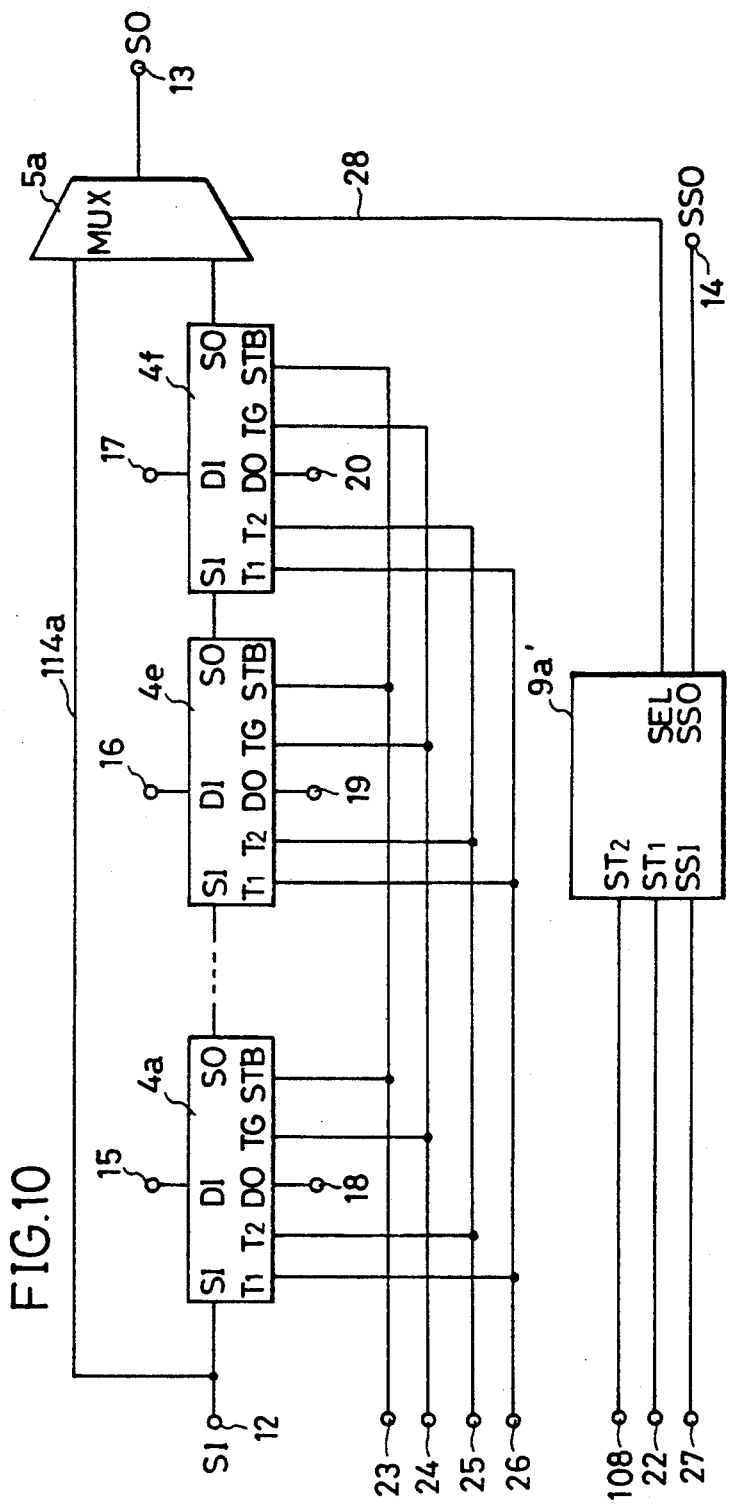
FIG. 10 is a schematic block diagram showing the structure of a testing circuit used in another embodiment of the present invention.

For example, the non-selected scan path in the above embodiment (the scan path in the case where the bypass line is selected) never performs shifting operation at the time of testing. This is to prevent unexpected data from being applied to the blocks not under test or generate unnecessary power consumption, as explained above. However, when these are not required, there are some cases where the non-selected scan path may carry out shifting operation. FIGS. 9 and 10 are circuit block diagrams of the selecting data holding/propagating circuit and testing circuit of such a case.

Referring to FIG. 9, selecting gate holding/propagating circuit 9a, in accordance with this embodiment has the following points differing from the selecting data holding/propagating circuit 9a of FIG. 4. Selecting data holding/propagating circuit 9a' does not include the control signal gate circuit 86 of FIG. 4. Also, clock signal ST2 is applied from ST2 terminal 105 to the gate of transmission gate 70. Clock signals ST1 and ST2 are non-overlapping two-phase clock signals. All other points of selecting data holding/propagating circuit 9' are identical to those of selecting data holding/propagating circuit 9a of FIG. 4. Identical reference numbers are denoted to identical components. Their functions and terms are also identical. These details will therefore not be repeated.

Clock signal ST2 is identical to clock signal T2 when the testing circuit is in the test data shift-in mode of FIG. 5 or in the operational mode of the test result shift out. The operation of selecting data holding/propagating circuit 9a' is identical to that of selecting data holding/propagating circuit 9a of FIG. 4. That is to say, data provided from SSI terminal 69 is propagated serially to SSO terminal 75 via latch circuits 84 and 85.

When the desired data is set at latch circuit 85, the selecting signal applied to MUX 5a is provided from SEL terminal 76.

Referring to FIG. 10, each of SRLs 4a–4f are applied with the strobe signal, the timing signal, and clock signals T1 and T2, not through selecting data holding/propagating circuit 9a', but through control signal input terminals 23–26.

At the time of testing, each of SRLs 4a–4f is responsive to the strobe signal, the timing signal, and clock signals T1 and T2 to carry out shifting operation, regardless of whether or not the scan path constituted by SRLs 4a–4f is selected or not. Even when the module set with SRLs 4a–4f is not the object of testing, data applied to the module will change variously. Because the functional module of the block not under test can be operated by the change of the input, a certain amount of power is consumed. The power consumption of only the functional module of the block under test can not be measured precisely. However, in the case where such an advantage is not necessary, there are the benefits that the integrated circuit can be designed in simple structures and the desired modules can be tested in a short time by employing the structures shown in FIGS. 9 and 10.

The above mentioned embodiment is implemented with a structure where the selecting data is propagated serially on a scan path selecting data propagation path provided individual to the scan path. If not only the test data, but also the selecting data is propagated on the scan path, the number of signal lines and data I/O pins can be reduced furthermore. Such an embodiment will be explained hereinafter.

Figure 11:
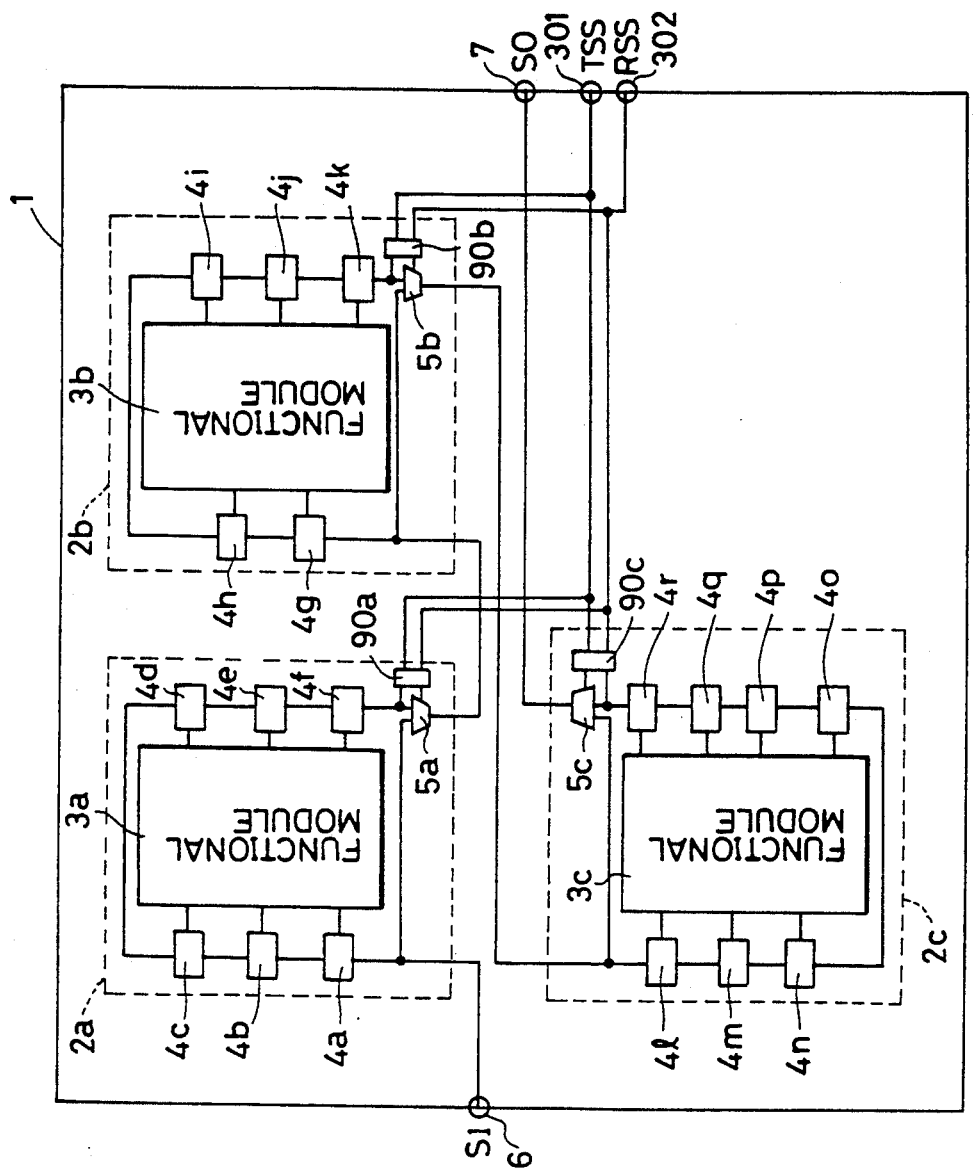
FIG. 11 is a schematic block diagram showing the structure of an integrated circuit device according to another embodiment of the present invention.

FIG. 11 is a schematic block diagram showing the structure of an integrated circuit of another embodiment of the present invention In this embodiment, the scan path formed of SRLs 4a–4r is used not only as the test data propagation path, but also as the scan path selecting data propagation path. Accordingly, the embodiment of FIG. 11 is provided with selecting data holding circuits 90a-90c instead of selecting data holding/propagating circuits 9a-9c of the embodiment of FIG. 1. Each of selecting data holding circuits 90a-90c is connected to the scan path of the corresponding module to receive the selecting data from the scan path. Referring to the embodiment of FIG. 11, selecting data setting signal (TSS) terminal 301 and reset signal (RSS) terminal 302 are provided. The selecting data setting signal applied from TSS terminal 301 and the reset signal applied from RSS terminal 302 are respectively applied to selecting data holding circuits 90a-90c. Because other elements in the embodiment of FIG. 11 are identical to those in the embodiment of FIG. 1, the corresponding elements have identical reference numbers, and the descriptions thereof will not be repeated.

Figure 12:
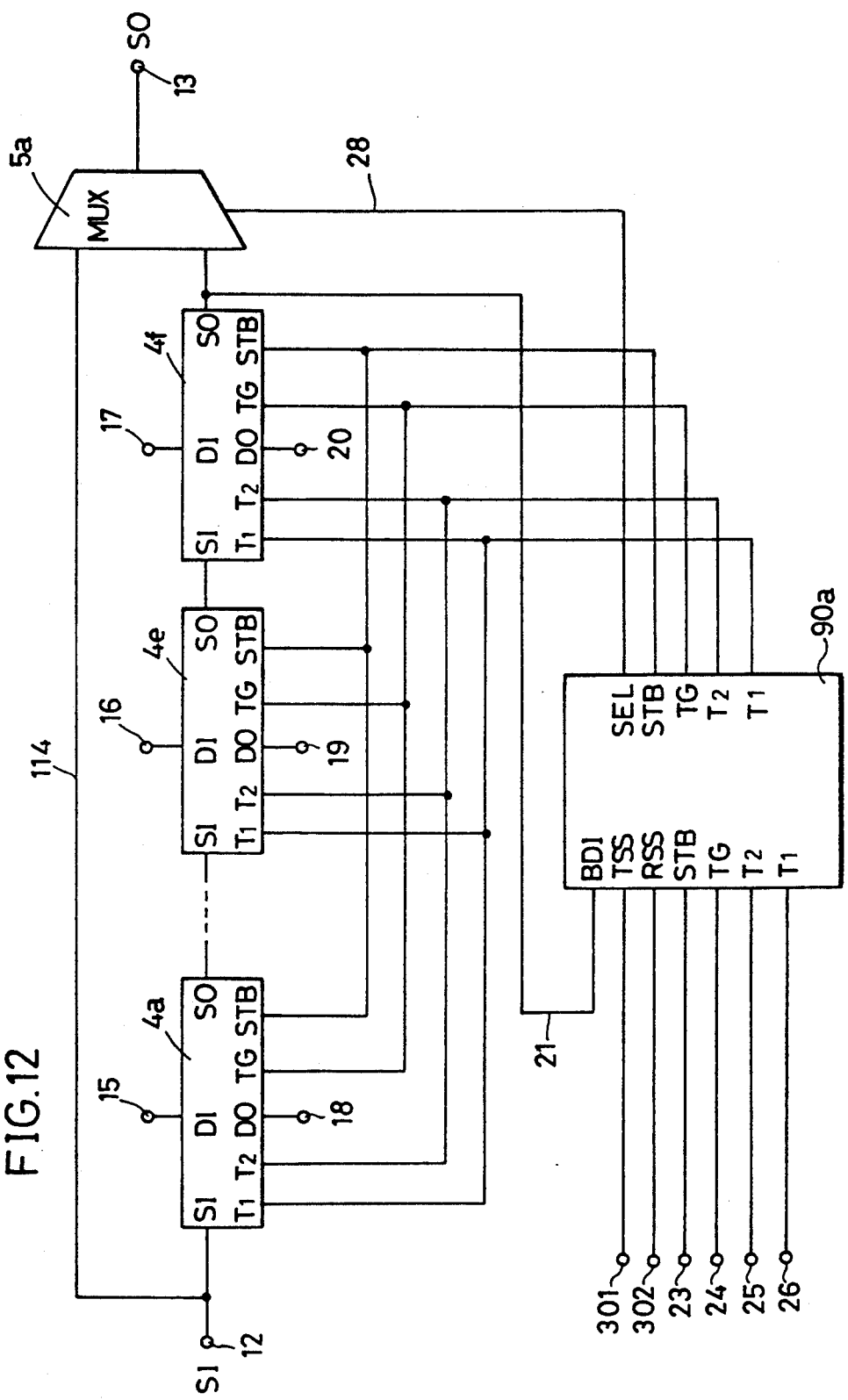
FIG. 12 is a block diagram showing the structure of a testing circuit in module 2a in the embodiment of FIG. 11.

FIG. 12 is a detail block diagram of a testing circuit including a scan path, bypass line 114, selecting circuit (MUX) 5a, and selecting data holding circuit 90a of module 2a of FIG. 11.

Referring to FIG. 12, the data output from output terminal SO of SRL 4f is provided to MUX 5a, and to selecting data holding circuit 90a via selecting data fetching line 21. Selecting data holding circuit 90a is provided with a setting signal from TSS terminal 301 (refer to FIG. 11), and with a reset signal from RSS terminal 302 (refer to FIG. 11).

Figure 13:
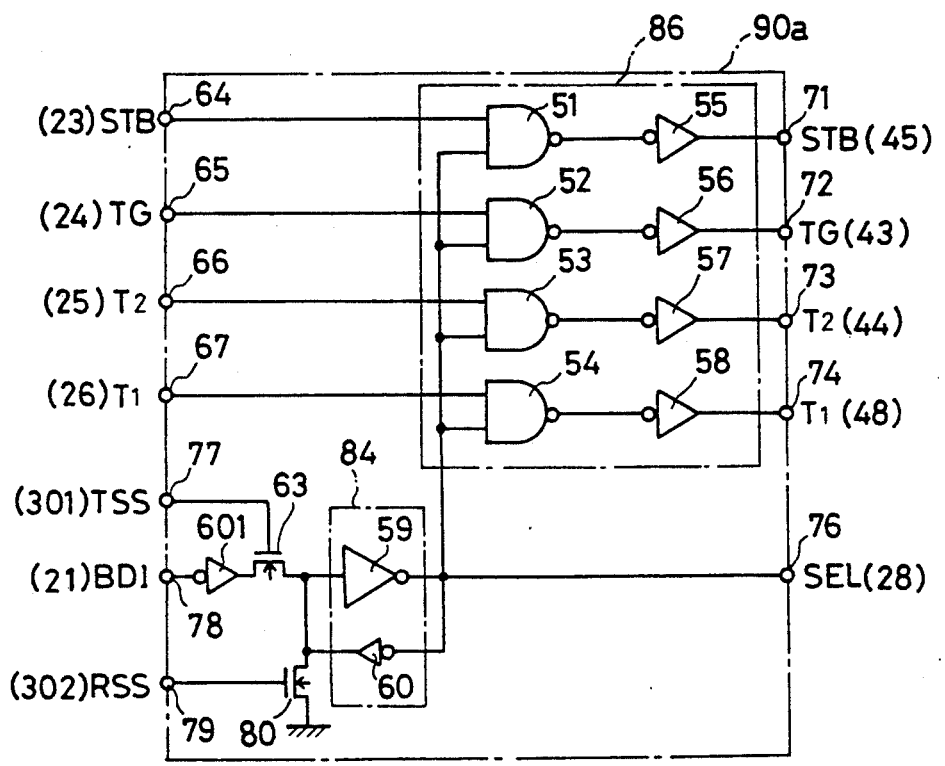
FIG. 13 is a circuit diagram showing a detail structure of a selecting data holding circuit 90a used in the embodiment of FIG. 11.

Referring to FIG. 13, the detail structure of selecting data holding circuit 90a is explained. Selecting data holding circuit 90a is different from the selecting data holding/propagating circuit 9a of FIG. 4 in the following points. That is to say, BDI terminal 78 is connected to the input of transmission gate 63 constituted by a n channel transistor. The gate of transmission gate 63 is connected to TSS terminal 77. BDI terminal 78 is connected to selecting data fetching line 21 of FIG. 12. TSS terminal 77 is connected to TSS terminal 301 of FIG. 11. A transistor 80 for reset is inserted between the input of latch circuit 84 and ground. The gate of reset transistor 80 is connected to RSS terminal 79. RSS terminal 79 is connected to RSS terminal 302 of FIG. 11. The output of latch circuit 84 is connected to SEL terminal 76, as well as to each one input terminal of NAND gates 51-54. Because other elements of selecting data of holding circuit 90a of FIG. 13 are identical to those of selecting data holding/propagating circuit 9a of FIG. 4, the corresponding elements have identical reference numbers, and the description will be omitted. The other selecting data holding circuits 90b and 90c have structures similar to that of the selecting data holding circuit 90a of FIG. 13.

The selecting data holding circuit 90a is not provided with transmission gate 70 and latch circuit 85 which are included in selecting data holding/propagating circuit 9a. This is because only the holding and not the propagation of selecting data is required for selecting data holding circuit 90a.

The operation of the embodiments of FIGS. 11-13 will be explained with reference to the timing charts of FIGS. 14 and 15. Similarly to the embodiment of FIG. 1, the testing circuit of the integrated circuit of the present embodiment has three operational modes; a scan path selecting mode for determining which scan path to select; a functional module test mode for testing the functional module by the selected scan path; and a normal operational mode for operating the integrated circuit device under the normal function. Details of each operation mode will be explained in order.

(1) Scan Path Selecting Mode

The selecting data for controlling each of MUXs 5a-5c is propagated serially on the scan path to be set in each of selecting data holding circuits 90a-90c.

It is therefore necessary that all MUXs 5a-5c are first in a state selecting the output of the scan path, and not the bypass line. The reset signal applied from RSS terminal 302 is activated to the H level for this purpose.

Referring to FIG. 13, selecting data holding circuit 90a, for example, operates as in the following manner. Because the reset signal applied from RSS terminal 79 is at an H level, transistor 80 for reset is ON. This causes the output potential of latch circuit 84 to be fixed at the H level. The H level output of latch circuit 84 is provided to MUX 5a via SEL terminal 76. Since the selecting signal applied to MUX 5a is at the H level, the output from the scan path, i.e. the output of SRL 4f is selected and provided to SO terminal 13. Identical operation is carried out in the other selecting data holding circuits 90b and 90c. This operation is shown as the "reset" cycle of FIG. 15.

After the output of the scan path is selected in all MUXs 5a-5c, the selecting data is applied serially from SI terminal 6. Also, non-overlapping two-phase clocks T1 and T2 are applied from T1 terminal 67 and T2 terminal 66, respectively. Because the output potential of latch circuit 84 is at the H level at this time, control signal gate circuit 86 is in an open state. Clock signals T1 and T2 are provided to each SRL via control signal gate circuit 86. Accordingly, each of SRLs 4a-4r carry out shifting operation in synchronization with clock signals T1 and T2. This results in the selecting data applied from SI terminal 6 to be shifted sequentially on the scan path. This operation is shown as the "selecting data shift in" cycle of FIG. 15.

When the selecting data applied from SI terminal 6 is propagated to SRLs 4f, 4k, and 4r which are the least significant bit (LSB) of each scan path, the selecting data setting signal provided from TSS terminal 301 to each of a selecting data holding circuits 90a-90c is activated to the H level. This causes the selecting data held in SRLs 4f, 4k and 4r to be fetched and held in selecting data holding circuits 90a, 90b, and 90c, respectively. This will be explained in detail using selecting data holding circuit 90a of FIG. 13 as an example. Transmission gate 63 is turned on by the selecting data setting signal attaining the H level. This causes the selecting data propagated via selecting data fetching line 21 from SRL 4f to be inverted at inverter 601, to be fetched and held in latch circuit 84. This operation is shown as the "selecting data fetch" cycle of FIG. 15.

The selecting state of each of MUXs 5a-5c is controlled by the selecting data set in selecting data holding circuits 90a-90c. For example, when functional testing of functional module 3a is to be executed, the SRLs required for testing are only SRLs 4a-4f included in module 2a. Therefore, the selecting data is set so that only MUX 5a selects the output of the scan path at this scan path selecting mode. The other scan paths are set at the non-selected state, and the test data is set to propagate the bypass line. The above is similar in cases where functional testing is carried out for other functional modules. The selecting data is set so that only the scan path corresponding to the functional module is at a selected state.

(2) Functional Module Test Mode

The cases where functional module 3a of FIG. 11, for example, is tested and not test will be explained hereinafter.

(a) When functional module 3a is not selected as the object of testing

The data set at latch circuit 84 is at a L level. Accordingly, the selecting signal provided from SEL terminal 76 to MUX 5a is at the L level. MUX 5a selects the output of bypass line 114 to provide the same to SO terminal 13. Data applied from SI terminal 12 is directly provided to SO terminal 13.

Because the output of latch circuit 84 is at the L level, control signal gate circuit 86 does not propagate any of the strobe signal, timing signal and clock signals T1 and T2 to SRLs 4a–4f. None of SRLs 4a–4f will operate, and the input and output states of functional module 3a maintain the same state.

This prevents unexpected data from being applied to a circuit block other than the block under test. It will also be possible to hold the power consumption of other circuit blocks to 0 by bringing the blocks not under test to the non-selected state in measuring the power consumption of only a certain circuit block.

(b) When functional module 3a is selected as the object of testing

Latch circuit 84 has a selecting data of the H level set therein. Selecting data holding circuit 90a provides an H level selecting signal to MUX 5a via SEL terminal 76. MUX 5a is responsive to the selecting signal to select the output of the scan path and provides the same to SO terminal 13.

Because the output of latch circuit 84 is at the H level, control signal gate circuit 86 is at an open state. The strobe signal, timing signal, clock signals T1 and T2 are applied to SRLs 4a–4f via gate circuit 86.

The structure of the SRL of the present embodiment is identical to that of the SRL of FIG. 3. Referring to FIG. 3, test data provided from SI terminal 12 (refer to FIG. 12) is applied to inverter 30 of SRL 4a, for example, via SI terminal 47. The H level of clock signal T1 causes transmission gate 40 to open. Then, the test data is stored in latch circuit 81.

Clock signal T2 is applied to the gate of transmission gate 41 from T2 terminal 44 to open transmission gate 41. The data held in latch circuit 81 is propagated to latch circuit 82. The output of latch circuit 82 is provided to the succeeding SRL 4b via inverter 38 and SO terminal 50.

By applying clock signals T1 and T2 to SRL 4a alternately, test data is propagated to the succeeding circuit via SI terminal 47, latch circuits 81 and 82, and SO terminal 50. Thus, test data is propagated serially on the scan path constituted by SRLs 4a–4f.

The desired test data is set in each of SRLs 4a–4f by sequentially applying test data from SI terminal 12 on the scan path. The test data is held in latch circuit 82 as the output potential of inverter 33.

Figure 14:
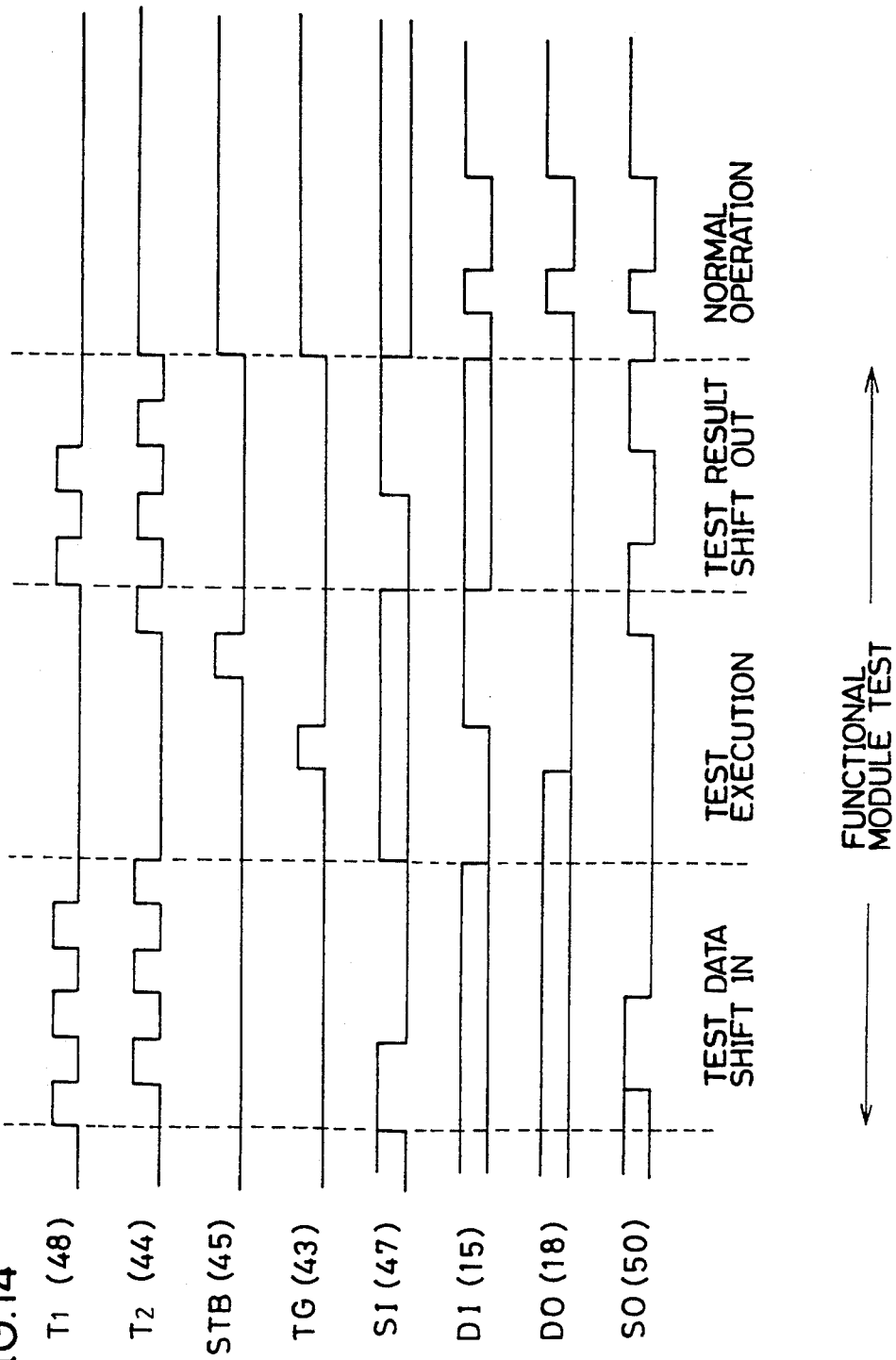
FIG. 14 is a time chart showing the operation of a shift register latch in the embodiment of FIG. 11.
Figure 15:
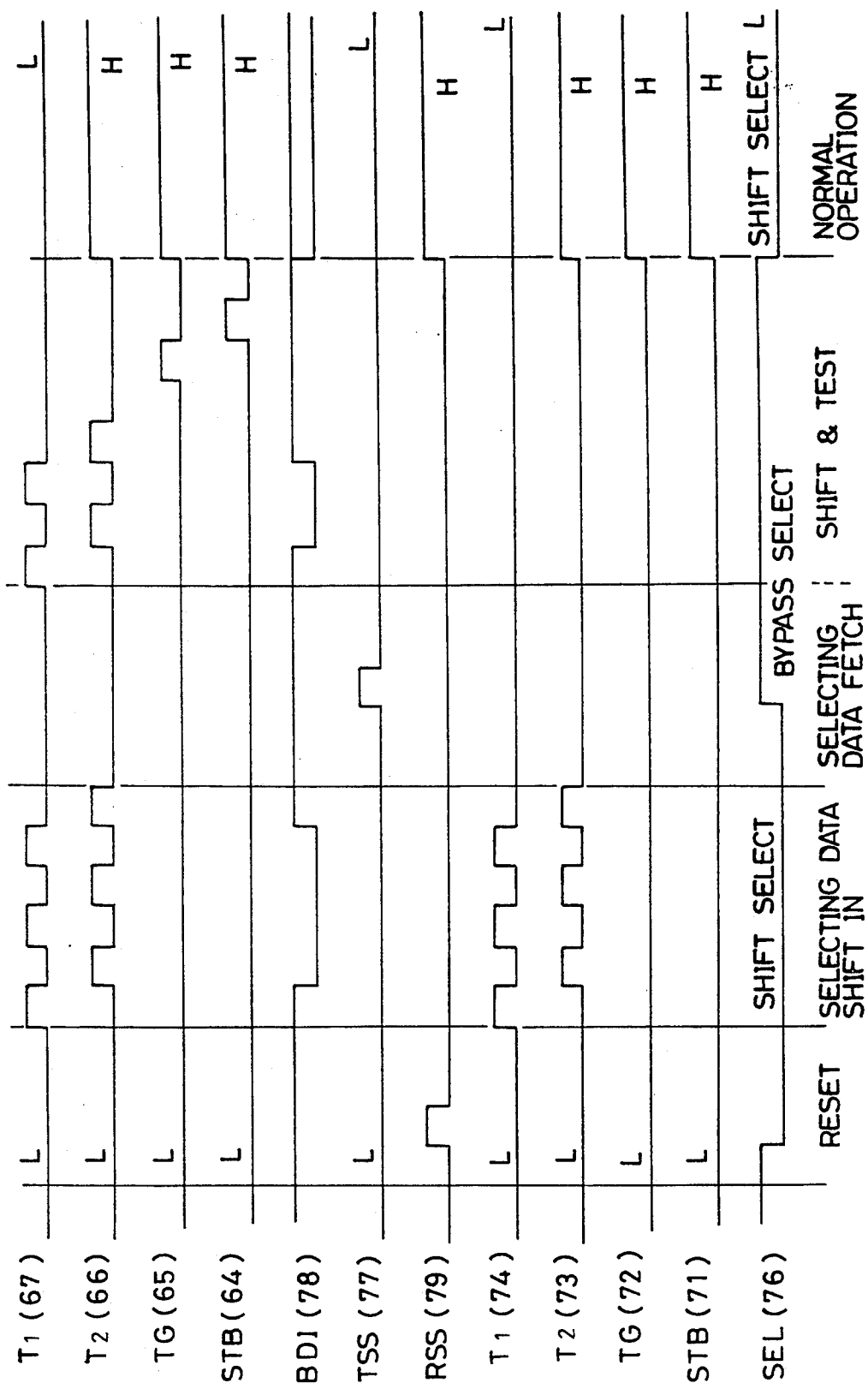
FIG. 15 is a timing chart showing the operation of the selecting data holding circuit of the embodiment of FIG. 11.

The aforementioned operation is shown in FIG. 14 as the "test data shift in" cycle.

Next, the timing signal is applied to transmission gate 42 via TG terminal 43. The data held in latch circuit 82 is propagated to latch circuit 83 to be inverted at inverter 37 and provided from DO terminal 18. DO terminal 18 is connected to the input terminal of functional module 3a (FIG. 11) to apply test data to functional module 3a.

Functional module 3a operates in response to the test data applied from the input terminal to provide the results to the output terminal. The output terminal of functional module 3a is connected to DI terminal 15 of SRL 4a, for example.

As shown in the "text execution" cycle of FIG. 14, the strobe signal specifying the storing of data is applied to transmission gate 39 of SRL 4a from STB terminal 45, after the timing signal is returned to a L level. In response, transmission gate 39 is opened, whereby data applied from DI terminal 15 is held in latch circuit 81. Clock signal T1 is held at the L level during this period. Latch circuit 81 holds the output data of functional module 3a. Then, the strobe signal is returned to the L level.

Clock signal T2 is applied to transmission gate 41 from T2 terminal 44 to open transmission gate 41. The data held in latch circuit 81 is applied to latch circuit 82. Then, non-overlapping two-phase clock signals T1 and T2 are applied to the gates of transmission gates 40 and 41, respectively. In response, the data stored in latch circuit 82 is provided to the succeeding SRL 4b from SO terminal 50. Similarly to the operation at the time of the aforementioned test data shift in, each of SRLs 4a–4f sequentially provide the data applied from SI terminal to SO terminal. Data of the test result held in each of SRLs 4a–4f are provided serially from SRL 4f to MUX 5a.

Referring to FIG. 12, MUX 5a is set so as to provide the data of the scan path side, as mentioned above. The data of the test results are therefore provided to SO terminal 13. In other words, when testing of the desired functional module is carried out according to the test data applied from SI terminal 6 in integrated circuit 1 (FIG. 11), the test results cross the scan path to be provided serially from SO terminal 7. The test results can be identified by collating the output of SO terminal 37 with a previously prepared data.

The aforementioned cycle is shown in FIG. 14 as the "test result shift out" cycle.

These operations are continued until all the test patterns of functional module 3a are completed.

(c) If the testing of functional module 3a has ended and it is necessary to test other functional modules, the operations of (a) and (b) will be repeated.

(d) On the termination of testing, integrated circuit 1 (FIG. 11) must be returned to the normal operational mode. It is therefore necessary to set the required data at each of selecting data holding circuits 90a–90c. This operation is carried out by serially propagating data specifying the normal operation from SSI terminal 10 on the scan path. This operation is identical to that of the aforementioned "scan path selecting mode".

(3) Normal Operational Mode

During normal operation, each of the SRLs must not affect the data flow between each functional module. SRLs 4a–4r are controlled to operate as a simple non-inverting driver allowing unrestricted data transmission from DI terminal to DO terminal 18, in normal operational mode.

For achieving the aforementioned state, RSS terminal 302 is first fixed to the H level. This causes transistor 80 for reset to be turned on in selecting data holding circuit 90a of FIG. 13, for example, whereby the input of latch circuit 84 is grounded to a L level. This results in the output potential of latch circuit 84 to attain the H level. In response, control signal gate circuit 86 attains an open state. Meanwhile, STB terminal 64, TG terminal 65, and T2 terminal 66 are fixed to a H level, and T1 terminal 67 is fixed to a L level. Because control signal gate circuit 86 is in an open state at this time, TG terminal 43, T2 terminal 44, and STB terminal 45 of FIG. 3 is fixed at the H level, and T1 terminal 48 is fixed at the L level. As a result, transmission gate 40 is closed, while transmission gates 39, 41, and 42 are all opened. Accordingly, SRL 4a allows unrestricted data transmission between DI terminal 15 to DO terminal 18.

There are four inverters 29, 31, 33, and 37 between DI terminal 15 and DO terminal 18. The data applied to DI terminal 15 is inverted 4 times and output from DO terminal 18 remaining as the applied value. In other words, SRL 4a operates as a non-inverting driver.

The operation of other SRLs 4b-4r is similar to that of the above mentioned SRL 4a. Data transmission between each functional module is not blocked, whereby integrated circuit 1 of FIG. 11 carries out normal operation without inconvenience.

Figure 16:
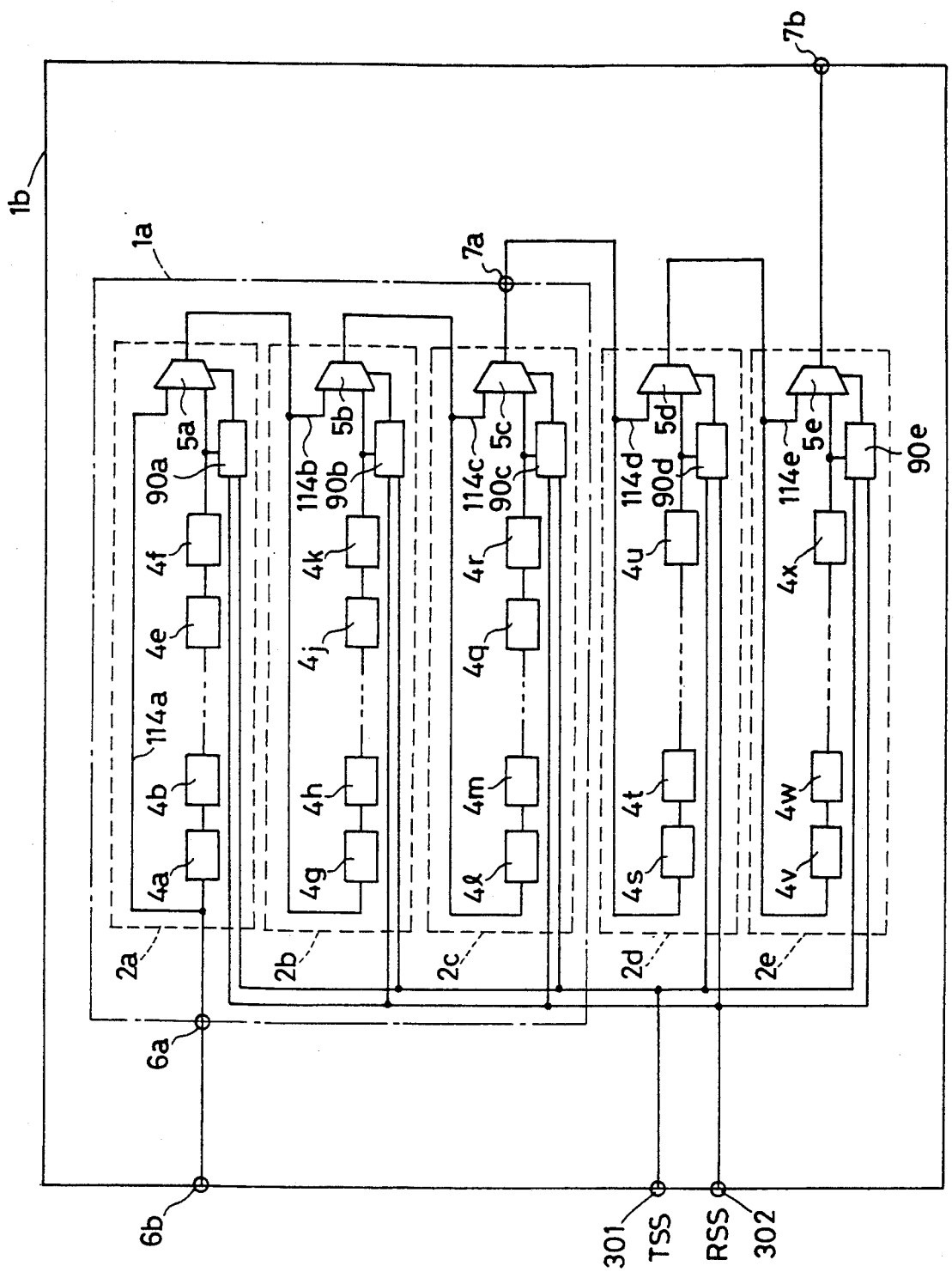
FIG. 16 is a schematic block diagram of an integrated circuit where the testing circuit techniques of the embodiment of FIG. 11 is applied to hierarchical design.

FIG. 16 is a schematic block diagram of an integrated circuit where the testing circuit techniques according to the embodiment of FIG. 11 is applied in hierarchical design. For purpose of simplicity, only the testing circuit of each module is shown in FIG. 16 as the structure element of each module.

Integrated circuit 1b of FIG. 16 has a structure identical to that of integrated circuit 1b of FIG. 7, except for the following points. That is to say, selecting data holding circuits 90a-90e are provided instead of selecting data holding/propagating circuits 9a-9e. SSI terminal 10, SSO terminal 11, and the signal line connecting in series each of selecting data holding/propagating circuits 9a-9e between SSI terminal 10 and SSO terminal 11 are removed. Integrated circuit 1b of FIG. 16 is provided with TSS terminal 301 and RSS terminal 302. TSS terminal 301 and RSS terminal 302 are connected to each of selecting data holding circuits 90a-90e.

Integrated circuit 1b of FIG. 16 has the following advantages similar to those of integrated circuit 1b of FIG. 7.

Although the lower level module 1a in integrated circuit 1b of FIG. 16 comprises three bottom level modules 2a-2c, the structures thereof are identical to the structure where module 1a is designed as an individual integrated circuit. Similarly, the structure of bottom level modules 2a-2c is identical to the structure where each is designed as an individual circuit. There is no necessity of modifying the structure in hierarchical design.

With reference to FIG. 16, only the provision of MUXs and selecting data holding circuits in the bottom level module is necessary. There is no need to incorporate new structure elements in designing upper hierarchical module. Complicated wiring is not required because the selecting data is propagated via the scan path in each selecting data holding circuit. It is possible to improve layout efficiency in comparison with hierarchical design of conventional integrated circuits.

Figure 17:
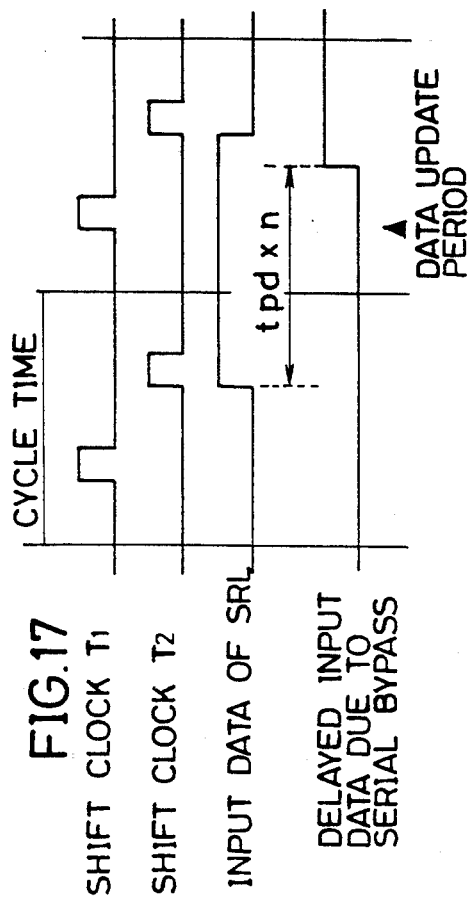
FIG. 17 is a timing chart for explaining the problems occurring in the embodiments of FIGS. 1 and 11.

In the above mentioned embodiments, data is propagated only through MUX in the module where the bypass line is selected. At this time, the propagated data is delayed (tpd) by the MUX. This means that there is a total delay of tpd×n in the case where there are n serial modules having the bypass line selected. This delay time will not affect the shift operation if it is sufficiently small compared with the shift cycle time of each scan path. If the delay time is not negligible in comparison with the shift cycle, as in FIG. 17 for example, normal data shifting is not possible. On the other hand, if the shift cycle time is delayed for carrying out normal data propagation, another problem that the shift time increases is generated.

Figure 18:
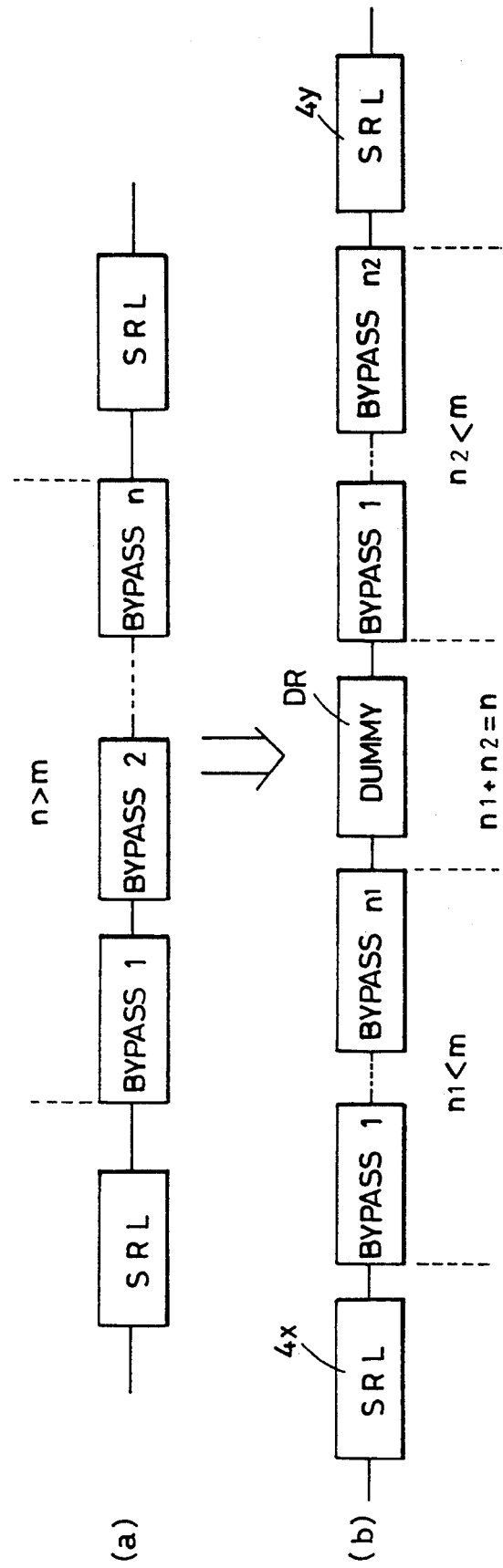
FIG. 18 is an explanatory diagram for describing the principle of a further embodiment of the present invention.

By obtaining in advance the value of n where the propagation delay (tpd×n) generated by serial bypass lines is longer then the next data update timing (the H level period of clock signal T1) as m, it is possible to ensure normal data propagation by inserting a dummy register DR performing only shifting operation in the serial bypass lines (refer to FIG. 18(b)), when the number of serial selected bypass lines is more than m (in the case of FIG. 18(a)). That is to say, the n bypass lines selected serially is divided into the former n1 lines and the latter n2 lines by having a dummy register DR inserted, as in FIG. 18(b). There is the delay of tpd×n1 between SRL 4x and dummy register DR, and a delay of tpd×n2 between dummy register DR and SRL 4y. Because n1 and n2 are respectively smaller than m, the delay times of tpd×n1 and tpd×n2 are in the range of a delay time which does not affect the shifting operation. According to the embodiment of FIG. 18, normal data propagation can be ensured without delaying the shift cycle time.

A newly provision of a dummy register DR as shown in FIG. 18(b) means an additional circuit element, resulting in an increase in circuit scale. If any of the SRLs forming each scan path is used as a dummy register, an effect similar to that of the embodiment of FIG. 18 can be obtained without adding a new element in the structure. Such an embodiment will be explain hereinafter.

Figure 19:
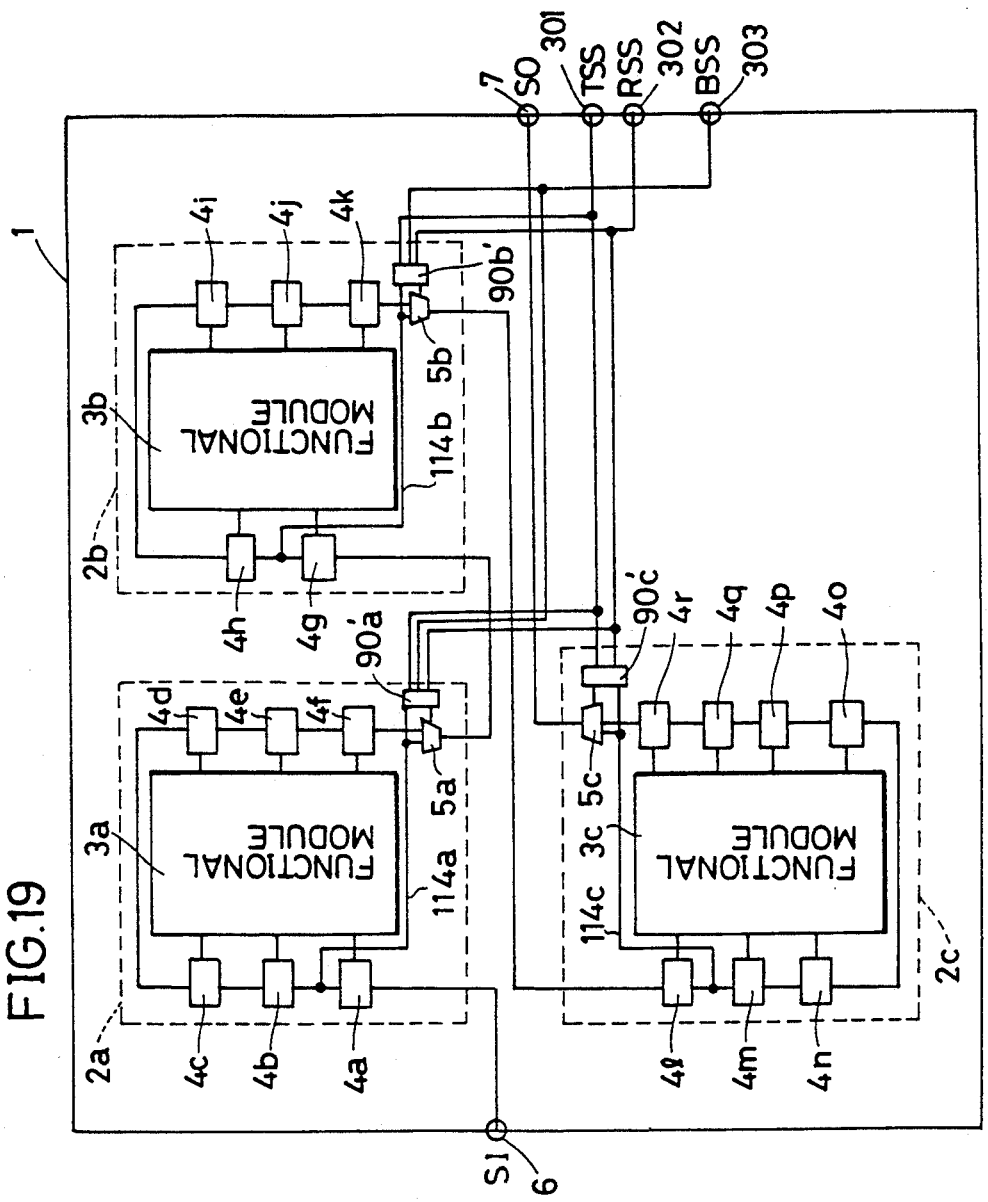
FIG. 19 is a schematic block diagram showing the structure of an integrated circuit device according to a further embodiment of the present invention.

FIG. 19 is a schematic block diagram showing the structure of a further embodiment of the present invention. The embodiment of FIG. 19 uses one of the SRLs forming each scan path as a dummy register. For this purpose. bypass line 114a has one end connected to the output end of SRL 4a and the other end connected to one input end of MUX 5a. Bypass line 114b has one end connected to the output end of SRL 4g and the other end connected to one input end of MUX 5b. Bypass line 114c has one end connected to the output end of SRL 4l and the other end connected to one input end of MUX 5c. The selecting data is propagated to selecting data holding circuits 90a'-90c' via respective bypass lines 114a-114c. The selecting setting signal is provided via TSS terminal 301 and the reset signal provided via RSS terminal 302 to each selecting data holding circuit. A bypass line selecting signal from bypass line selecting signal (BSS) terminal 303 is also provided to each selecting data holding circuit. Because other elements of the embodiment of FIG. 19 are similar to the integrated circuit device of the embodiment of FIG. 11, corresponding elements have identical reference numbers denoted, and the descriptions will not be repeated.

Figure 20:
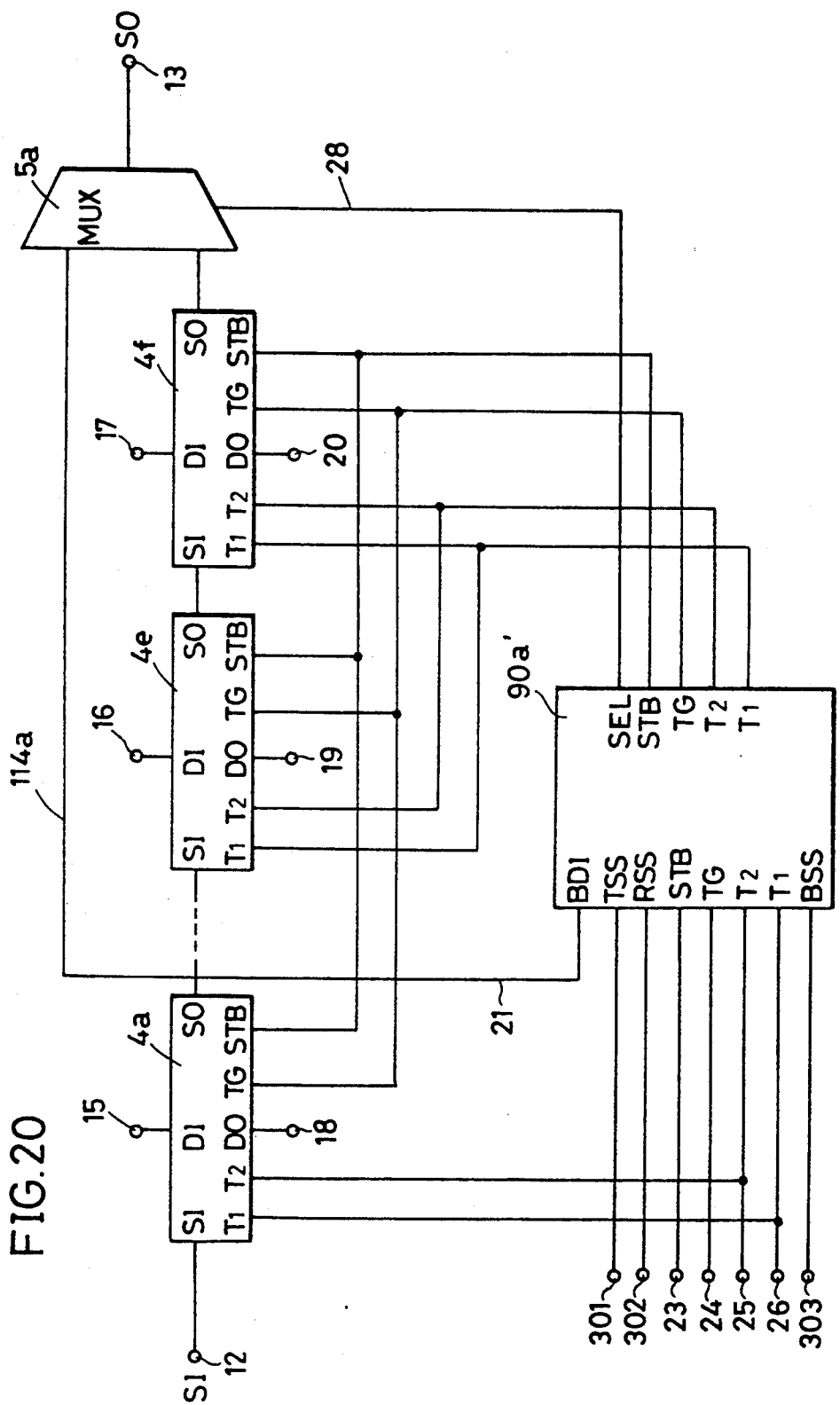
FIG. 20 is a block diagram of the structure of a testing circuit used in module 2a in the embodiment of FIG. 19.

FIG. 20 is a block diagram showing the structure of a testing circuit within module 2a of FIG. 19. In the figure, SO terminal of SRL 4a is connected to one input end of MUX 5a via bypass line 114a. SO terminal of SRL 4a is connected to BDI terminal of selecting data holding circuit 90a' via selecting data fetching line 21. BSS terminal 303 is connected to BSS terminal of selecting data holding circuit 90a'. Control signal input terminals 25 and 26 are connected to T2 terminal and T1 terminal of selecting data holding circuit 90a', as well as to T2 terminal and T1 terminal of SRL 4a. Because other elements of the testing circuit of FIG. 20 are similar to those of the testing circuit of FIG. 12, corresponding elements have identical reference numbers denoted, and their descriptions will not be repeated.

The structure of the testing circuits of other modules 2b and 2c are similar to the testing circuit of FIG. 20.

Figure 21:
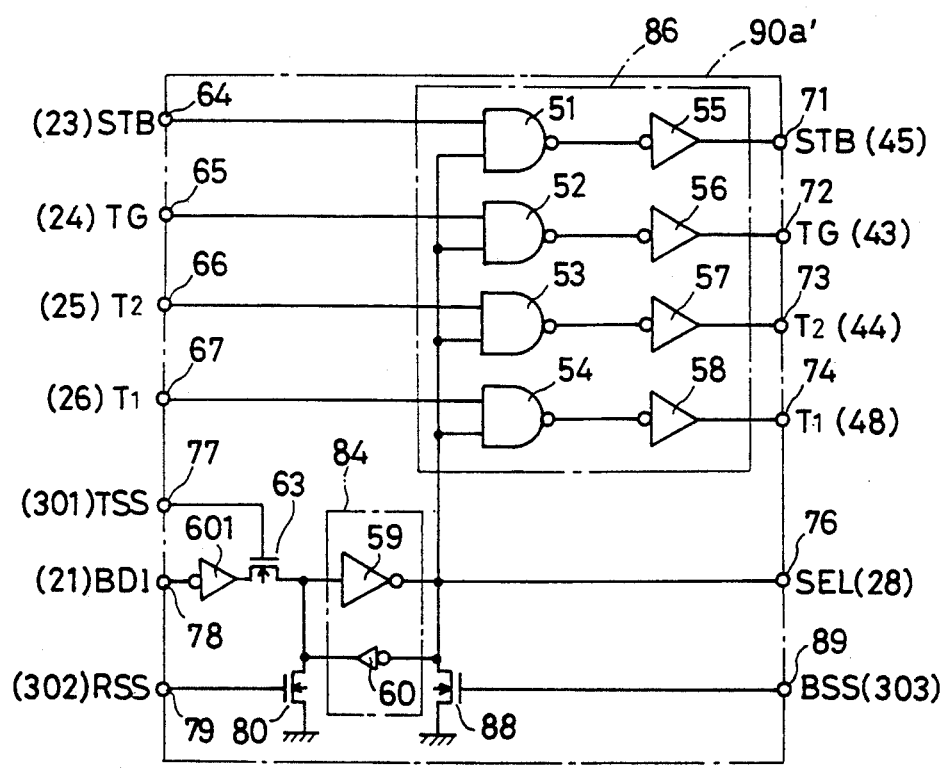
FIG. 21 is a circuit diagram showing the detail structure of a selecting data holding circuit 90a' employed in the embodiment of FIG. 19.

FIG. 21 is a circuit diagram of a detail structure of selecting data holding circuit 90a' of FIG. 19. In the figure, a n channel transistor 88 is inserted between the output end of latch circuit 84, i.e. the output end of inverter 59, and ground. The gate of transistor 88 is connected to BSS terminal 89. Because other elements of the selecting data holding circuit 90a' are similar to those of selecting data holding circuit 90a of FIG. 13, the corresponding elements have identical reference numbers denoted and their descriptions will be omitted.

The structures of other selecting data holding circuits 90b' and 90c' are similar to selecting data holding circuit 90a' of FIG. 21.

The operation of embodiments shown in FIGS. 19-21 are explained hereinafter. The operations will be described in three modes of (1) scan path selecting mode, (2) functional module test mode, and (3) normal operational mode, similar to the aforementioned embodiments.

(1) Scan Path Selecting Mode

Firstly, a voltage of H level is applied to BSS terminal 303, so that each of selecting data holding circuits 90a'-90c' is controlled to select the respective bypass lines 114a-114c.

Taking selecting data holding circuit 90a, as an example, the H level of BSS terminal 89 causes transistor 88 to be turned on. This fixes the potential of the output end of latch circuit 84 to a L level. The selecting signal of the L level is provided to MUX 5a from SEL terminal 76 via selecting signal line 28. Therefore, MUX 5a selects bypass line 114a.

The operation of the testing circuits of other modules 2b and 2c is similar to the above operation.

Next, selecting data of a bit number equal to the number of scan paths are applied serially from SI terminal 6. At this time, non-overlapping two-phase clock signals T1 and T2 are provided to only SRLs 4a, 4g, and 4l. The selecting data is propagated through SRLs 4a, 4g, and 4l. When the desired selecting data is propagated to the selecting data propagation bit of each scan path, i.e. to SRLs 4a, 4g, and 4l, a signal of the H level is supplied to TSS terminal 301. Accordingly, a selecting data setting signal of a H level is provided to each of selecting data holding circuits 90a'-90c'.

For example, in selecting data holding circuit 90a', TSS terminal 77 attains the H level, to turn transmission gate 63 on. This causes the selecting data provided to BDI terminal 78 from SRL 4a to be inverted at inverter 601 and supplied to latch circuit 84. Latch circuit 84 holds the inverted data of the data propagated from SRL 4a as the selecting data.

The operations of other selecting data holding circuits 90b, and 90c, are similar to that of the above mentioned operation.

As set forth in the above operation, each of selecting data holding circuits 90a'-90c' is set with the selecting data. The embodiment of FIG. 11 is implemented so that the selecting data applied from SI terminal 6 is propagated through all bits, i.e. all SRLs in each scan path, whereas the embodiment of FIG. 19 is implemented so that the applied selecting data is propagated only through 3 bits, i.e. SRLs 4a, 4g, and 4l. The propagation path length of the selecting data in the embodiment of FIG. 19 is shorter than that of the embodiment of FIG. 11 to allow quick setting of the selecting data to each selecting data holding circuit.

(2) Functional Module Test Mode

The cases where functional module 3a of FIG. 19, for example, is tested and not test will be explained hereinafter.

(a) When functional module 3a is not selected as the object of testing

The data set at latch circuit 84 is at a L level. Accordingly, the selecting signal provided from SEL terminal 76 to MUX 5a is at the L level. MUX 5a selects the output of bypass line 114 to provide the same to SO terminal 13. At this time, SRL 4a is provided with non-overlapping two-phase clock signals T1 and T2. SRL 4a holds and shifts the data applied from SI terminal 12 in synchronization with clock signals T1 and T2. Therefore, data applied from SI terminal 12 is directly provided from SO terminal 13 via SRL 4a and MUX 5a.

Because the output of latch circuit 84 is at the L level, control signal gate circuit 86 does not propagate any of the strobe signal, timing signal and clock signals T1 and T2 to SRLs 4a-4f. Accordingly, none of SRLs 4a-4f will operate.

(b) When functional module 3a is selected as the object of testing

Latch circuit 84 has a selecting data of the H level set therein. Selecting data holding circuit 90a provides an H level selecting signal to MUX 5a via SEL terminal 76. MUX 5a is responsive to the selecting signal to select the output of the scan path and provides the same to SO terminal 13.

Because the output of latch circuit 84 is at the H level, control signal gate circuit 86 is at an open state. The strobe signal, timing signal, clock signals T1 and T2 are applied to SRLs 4b-4f via gate circuit 86. Also, the strobe signal and timing signal are applied to SRL 4a via gate circuit 86. Clock signals T1 and T2 are directly applied to SRL 4a without passing selecting data holding circuit 90a'.

In response to the control signals applied to each of SRLs 4a-4f, the scan path formed of SRLs 4a-4f carry out the "test data shift in "operation shifting sequentially the test data applied serially from SI terminal 12 and setting the same to a SRL, the "test execution" operation providing the test data set in a predetermined SRL to functional module 3a, and fetching and holding the test result data provided from functional module 3a to a predetermined SRL, and the "test result shift out" operation shifting sequentially the test result data held in a predetermined SRL and providing the same serially from SO terminal 13. Because the details of the "test data shift in", "test execution", and "test result shift out" operations are identical to those of the embodiment of FIG. 11, the corresponding description will not be repeated.

These operations are continued until all the test patterns of functional module 3a are completed.

(c) If the testing of functional module 3a has ended and it is necessary to test other functional modules, the operations of (a) and (b) will be repeated.

(d) On the termination of testing, integrated circuit 1 (FIG. 11) must be returned to the normal operational mode. It is therefore necessary to set the required data at each of selecting data holding circuits 90a'-90c'. This operation is carried out by serially propagating data specifying the normal operation from SI terminal 6 on the scan path. This operation is identical to that of the aforementioned "scan path selecting mode".

(3) Normal Operational Mode

The operation in normal operational mode is identical to that of the embodiment of FIG. 11. That is to say, because RSS terminal 302 is fixed to the H level, the output end of latch circuit 84 in each selecting data holding circuit is fixed to a H level. This causes control signal gate circuit 86 in each of selecting data holding circuits 90a'-90c' to attain an open state. Next, STB terminal 64, TG terminal 65, and TS terminal 66 are fixed to the H level, while T1 terminal 67 are fixed to the L level. This allows unrestricted data propagation between DI terminal to DO terminal in each of SRLs 4a-4r. That is to say, all SRLs 4a-4r operate as a simple non-inverting driver that does not affect the data flow between each functional module.

With the embodiments of FIGS. 19-21, the inconvenience that the delay time of the MUX in modules of non-selected scan paths (i.e. bypass line selected) are accumulated to prevent normal data propagation is solved, in functional module test mode, due to the fact that at least the first bit SRL in each scan path functions as a dummy register as shown in FIG. 18 (b), even if there are a plurality of modules of non-selected scan paths in series.

The number of the SRL used as a dummy register in each scan path is not limited to one, and may be two or more, for example.

Figure 22:
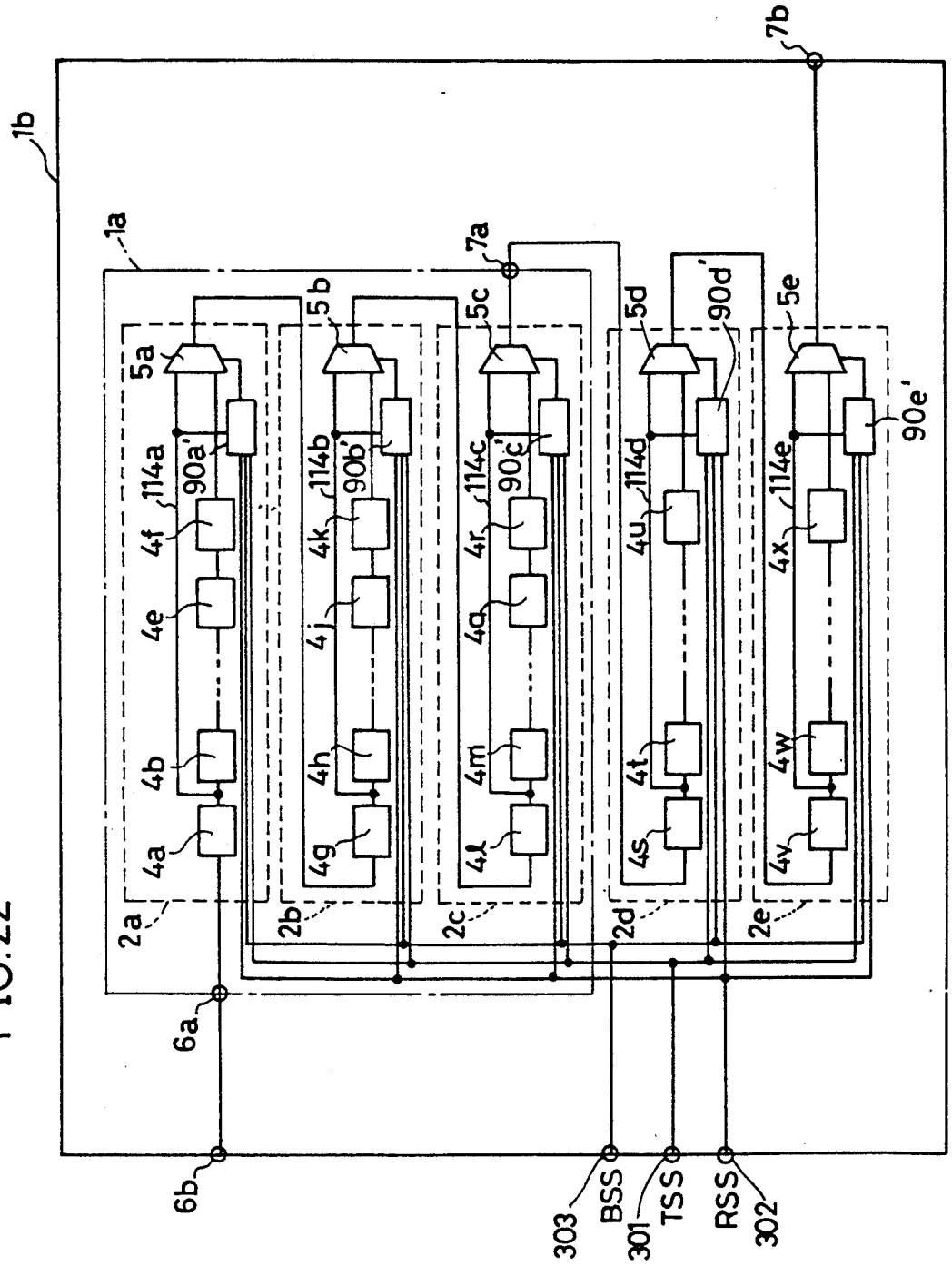
FIG. 22 is a schematic block diagram of the structure of an integrated circuit where the testing circuit techniques of the embodiment of FIG. 19 is applied in hierarchical design.

FIG. 22 is a schematic block diagram of an integrated circuited where the testing circuit techniques of the embodiment of FIG. 19 is applied in hierarchical design. For the sake of simplicity, only the testing circuit of each module is shown in FIG. 22 as the structure element of each module.

Integrated circuit 1b of FIG. 22 has a structure similar to that of integrated circuit 1b of FIG. 16, except for the following points. That is to say, selecting data holding circuit 90a'-90e' are provided instead of selecting data holding circuits 90a-90e. Also, BSS terminal 303 is added. BSS terminal 303 is connected to each of selecting data holding circuit 90a'-90e'. One ends of bypass lines 114a, 114b, 114c, and 114d are connected to the output ends of SRLs 4a, 4g, 4l, 4s, and 4v, respectively. The other ends of bypass lines 114a-114e are connected to one input ends of MUXs 5a-5e, as well as to selecting data holding circuits 90a'-90e', respectively.

Integrated circuit 1b of FIG. 22 has the following advantages similar to those of integrated circuit 1b of FIG. 16.

Although lower level module 1a in integrated circuit 1b of FIG. 16 includes three bottom level modules 2a-2c, the structure thereof is identical to that in the case where module 1a is designed as an individual integrated circuit. Similarly, the structure of each of bottom level modules 2a-2c is identical to that in the case each is individually designed. Therefore it is not necessary to apply any modification to the structure thereof in hierarchical design.

It is apparent from FIG. 22 that only the provision of MUXs and selecting data holding circuits are necessary in the bottom level module. There is no need to incorporate a new structure element in designing the above mention modules. Complicated wiring is not required because the selecting data is propagated via a bypass line in each selecting data holding circuit. It is possible to improve the layout efficiency in comparison with hierarchical design of conventional integrated circuits.

Figure 23:
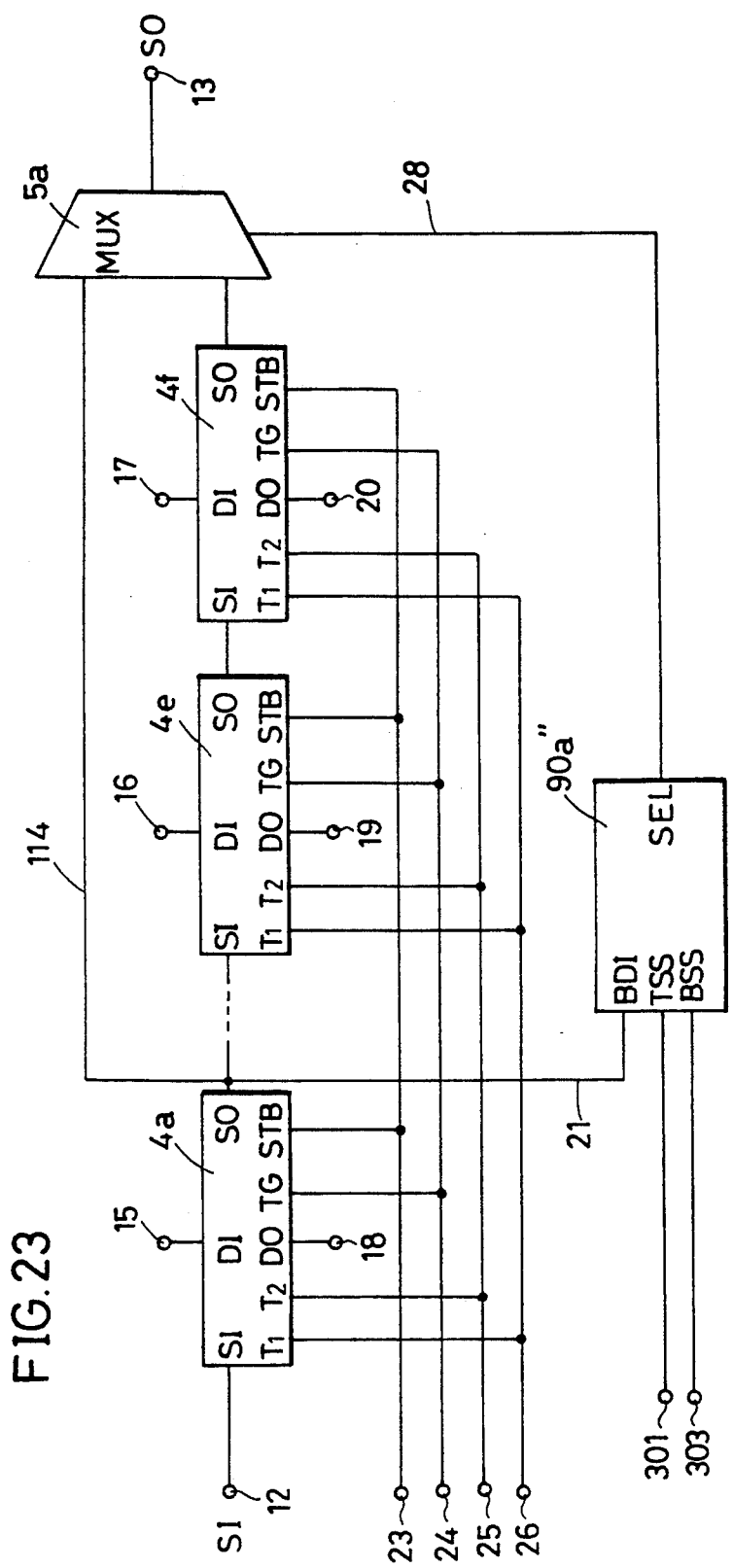
FIG. 23 is a schematic block diagram of a testing circuit structure used in an integrated circuit device of a further embodiment of the present invention.

FIG. 23 is a block diagram showing a structure of the testing circuit used in the integrated circuit of a further embodiment of the present invention. In this embodiment, the control signals applied from control signal input terminals 23-26, i.e. the strobe signal, the timing signal, clock signals T1 and T2 are directly applied to each of SRLs 4a-4f without passing the selecting data holding circuit. This means that SRLs 4a-4f are always in an operational state irrespective of the data held in selecting data holding circuit 90a''. Therefore, the control to turn all SRLs to an operational state by the reset signal applied to RSS terminal 302, as in the embodiment of FIG. 19, is not required. RSS terminal 302 is removed in the embodiment of FIG. 23 and a reset signal is not incorporated in selecting data holding circuit 90a''.

Figure 24:
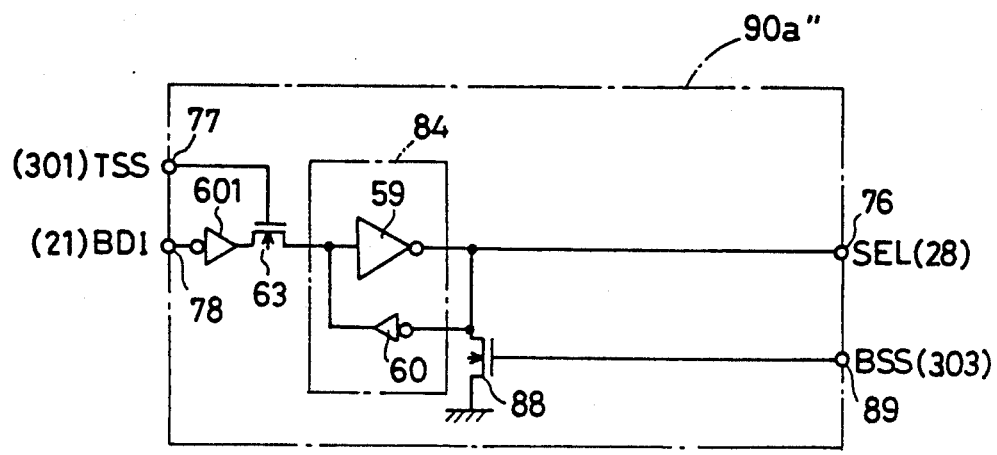
FIG. 24 is a circuit diagram showing a detail structure of the selecting data holding circuit 90a'' of FIG. 23.
Figure 25:
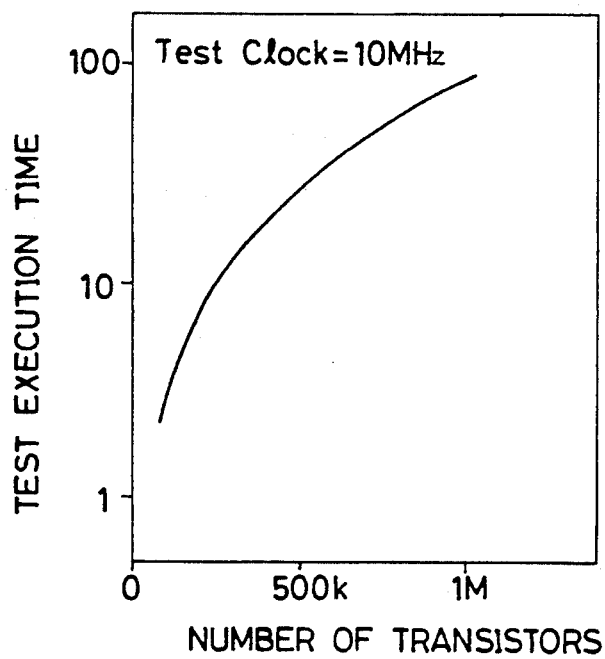
FIG. 25 is a graph showing the relationship of the scale of the circuit and the testing time.
Figures 26, 27:
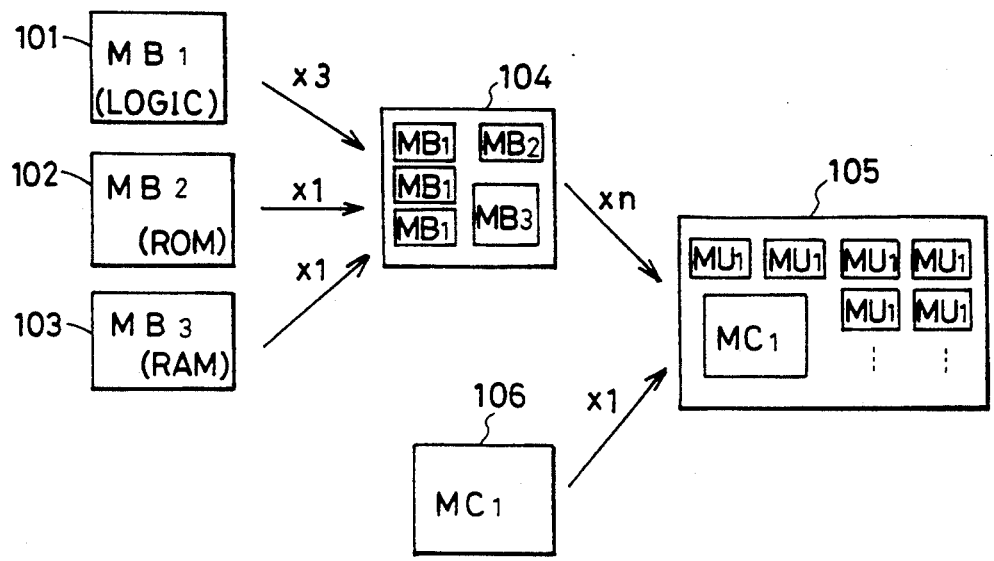
FIG. 26 is a diagram showing the structure of the chip which is the module of the graph of FIG. 25.
FIG. 27 is a diagram showing the elemental features of the chip of FIG. 26.
Figure 28:
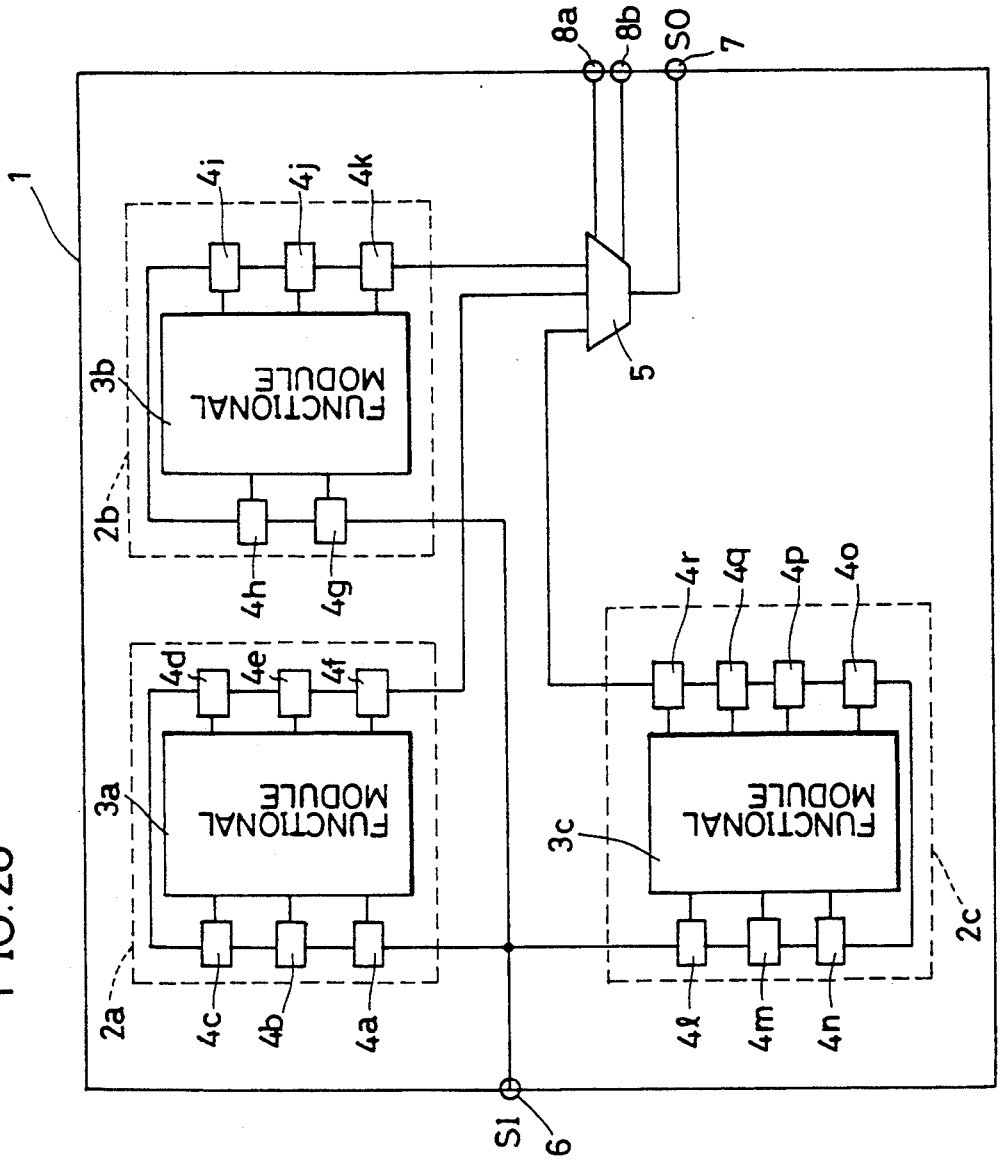
FIG. 28 is a schematic block diagram of an integrated circuit incorporating a conventional testing circuit.
Figure 29:
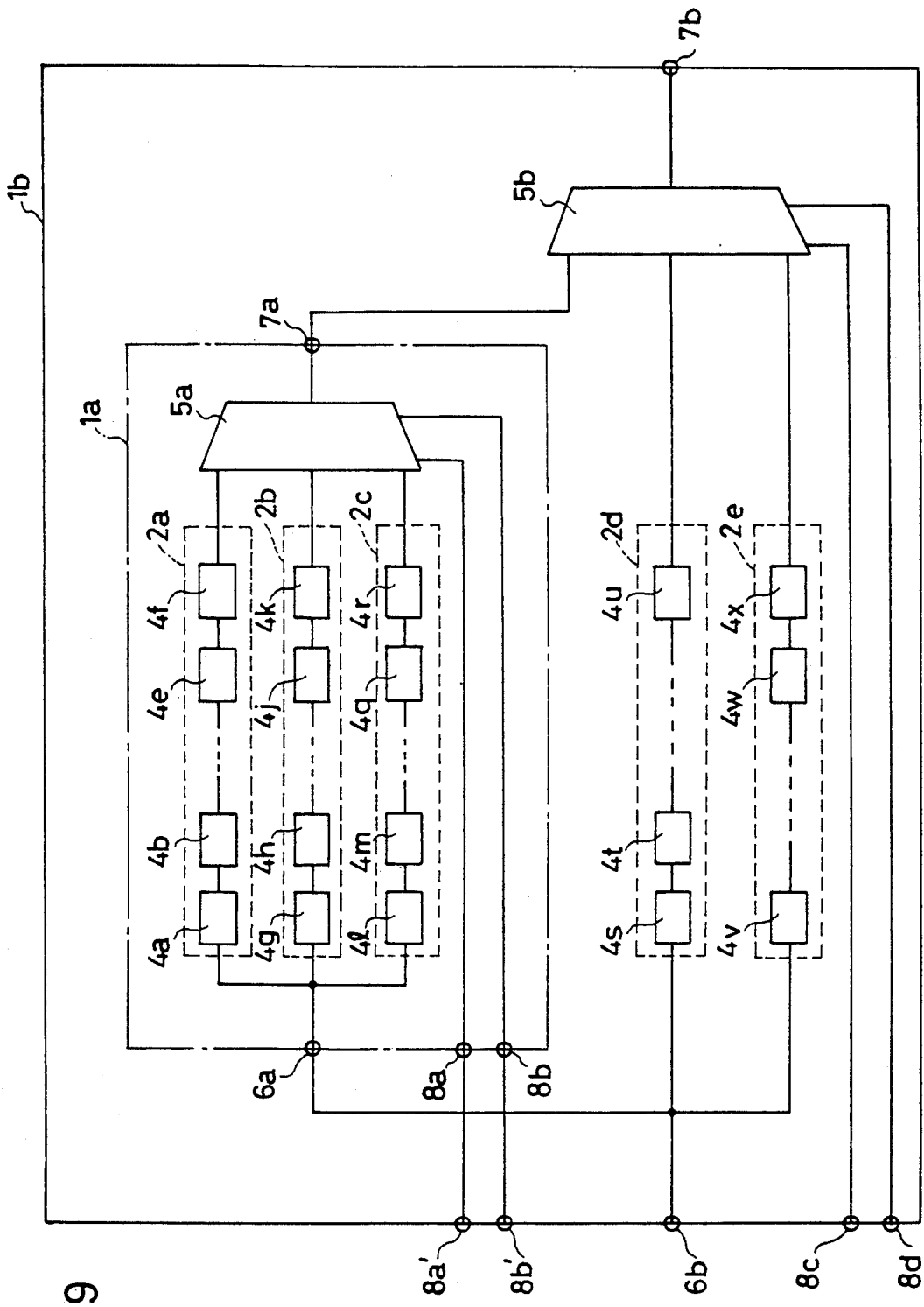
FIG. 29 is a schematic block diagram of an integrated circuit device hierarchically designed by conventional testing circuit design.

FIG. 24 is a circuit diagram showing a detail structure of selecting data holding circuit 90a'' of FIG. 23. In the figure, selecting data holding circuit 90a'' is similar to selecting data holding circuit 90a, of FIG. 21, except for the following points. That is to say, selecting data holding circuit 90a'' is not provided with control signal gate circuit 86. Also, transistor 80 for reset is not provided in selecting data holding circuit 90a''.

Because other elements of the testing circuit of FIG. 23 are similar to those of the testing circuit of FIG. 20, the corresponding elements have identical reference numbers denoted, and the descriptions thereof will not be repeated. Each modules implemented in the integrated circuit is provided with a testing circuit having a structure similar to that shown in FIGS. 23 and 24.

In the embodiment of FIG. 23, each of SRLs 4a-4f carry out shifting operation in response to the strobe signal, timing signal, clock signals T1 and T2, regardless of whether the scan path formed of SRLs 4a-4f is selected or not at the time of testing. Even if a module having SRLs 4a-4f set is not the object of testing, various changing data are applied to that module. Also, functional modules that are not the object of testing may possibly operate due to the change of input to consume a certain amount of power. It is therefore not possible to measure precisely the power consumed by the tested functional module. However, there is an advantage that the integrated circuit can be designed in simple structures by employing the structure shown in FIGS. 23 and 24.

It will be appreciated that the invention is not limited to the embodiment described, and many variations are possible. Other variations of the present invention will be explained hereinafter.

(1) The above described embodiments are implemented so that a scan path is provided individually for each functional module, where only the testing of the corresponding functional module is carried out. Each functional module may not have to be provided individually with a scan path. It is only required that the scan path is implemented so that the testing of an arbitrary functional module is carried out. For example, a scan path may be implemented to apply test data to a certain functional module and fetch the test result data from another functional module. Alternatively, a scan path may be implemented to apply test data to a plurality of functional modules and fetch the test result data from a plurality of functional modules.

(2) Although the logic circuit within the integrated circuit device is modularized as a functional module for each predetermined block, it is not necessary to modularize each logic circuit.

(3) Although each scan path is implemented having a plurality of bits, i.e. a plurality of SRLs in the aforementioned embodiments, each scan path may be implemented with 1 bit.

(4) Each scan path may not only carry out testing of the logic circuit in the integrated circuit device, but also be used for checking disconnection of signal lines interposed between control points and observation points, for example.

(5) It is not necessary to connect the SRLs forming each scan path to both the control point and the observation point in the integrated circuit device. The SRL may be connected only to either of them.

(6) Although each scan path is used for testing within the integrated circuit device, it may be used for other applications. For example, each scan path may be used for propagating data other than test data (system data for example) to a control point within the integrated circuit device, and fetch and shift data from an observation point for external provision.

(7) The testing of a plurality of integrated circuit devices may be carried out simultaneously, by mounting a plurality of integrated circuit devices, each provided with one or a plurality of scan paths, on one board, and connecting the scan path in series between each integrated circuit device. This means that there is a case where only one scan path is provided on one chip.

Thus, the present invention only requires the structure where any data (control point data) applied serially from an external source is propagated on a scan path to be provided to a control point within the integrated circuit device, and fetching and shifting an observation point data from an observation point to externally provide the same serially. The usage thereof or the structure and the number of the scan paths are not limited by the aforementioned embodiments.

In accordance with the present invention, the number of signal lines for propagating the selecting data and the number of input/output pins thereof are always constant regardless of the internal structure of the integrated circuit device. It is therefore possible to reduce wiring area and the number of terminals in comparison with a conventional integrated circuit device where the number of signal lines and I/O pins increase as the number of functional modules increase.

Also, in accordance with the present invention, the selecting data holding means and bypass means are provided for each shift register means. It is possible to alleviate the load of integrated circuit device design by increasing or decreasing each means according to the modification of the internal structure of the integrated circuit device, in case of modification.

Furthermore, in accordance with the present invention, it is not necessary to modify the structures of shift register means, selecting data holding means, and bypass means in hierarchical design of the integrated circuit device. The addition of a new structure is also not required, which is significantly suitable for hierarchical design.

Furthermore, in accordance with the present invention, the selecting data holding means is provided external to the data propagation path formed by shift register means. The selecting data holding means does not generate wasteful bits in the data propagation path in propagating control point data or observation point data, so that control point data and observation point data can be propagated rapidly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated circuit device having a plurality of control points and a plurality of observation points therein, comprising:
    a single first data input terminal for serially applying control point data to be provided to said control points,
    a single first data output terminal for serially providing observation point data obtained from said observation points,
    a single second data input terminal for serially applying selecting data,
    a single second data output terminal,
    a plurality of shift register means connected in series to each other and inserted between said first data input terminal and said second data output terminal each coupled to said control point and/or said observation point,
    a plurality of selecting data holding means provided for each of said shift register means, and connected in series to each other and inserted between said second data input terminal and said second data output terminal, for shifting and holding said selecting data applied from said second data input terminal, and
    a plurality of bypass means provided for each of said shift register means, each operating in response to the selecting data held in the corresponding said selecting data holding means for forming a data bypass path with respect to the corresponding shift register means, when said selecting data does not select the corresponding said shift register means,
    said shift register means shifting said control point data applied from said first data input terminal and providing the same to the corresponding said control point, and fetching and shifting said observation point data from the corresponding said observation point to provide to said first data output terminal.

2. The integrated circuit device according to claim 1, further comprising a plurality of functional modules each including a predetermined logic circuit,
    wherein said control points and observation points are provided in association with each of said functional modules.

3. The integrated circuit device according to claim 2, wherein
    test data for said functional modules is serially applied as said control point data from said first input terminal, and
    test result data of said functional modules is serially provided as said observation point data from said first data output terminal.

4. The integrated circuit device according to claim 3, wherein a bypass means forms a data bypass path with respect to a corresponding shift register means coupled to a corresponding control point and corresponding observation point of a functional module not selected as the object of testing.

5. The integrated circuit device according to claim 4, wherein shift register means, selecting data holding means, and bypass means are provided for each of said functional modules.

6. The integrated circuit device according to claim 5, wherein a functional module, and shift register means, selecting data holding means, and bypass means provided corresponding to said functional module are modularized as one circuit block to constitute the lowest hierarchial design unit.

7. The integrated circuit device according to claim 6, wherein
a plurality of said functional modules, a plurality of said shift register means, a plurality of said selecting data holding means, and a plurality of said functional modules are modularized as an upper level circuit block constituting a higher hierarchical design unit, and
said plurality of shift register means are connected in series to each other within said upper level circuit block.

8. The integrated circuit device according to claim 1, wherein each of said shift register means comprises a plurality of shift register latch means connected in series to each other, each coupled to a corresponding one of said control points and/or a corresponding one of said observation points.

9. The integrated circuit device according to claim 8, wherein each of said shift register latch means comprises
latch means for latching data,
means for shifting data applied from said shift register latch means of the preceding stage into said latch means, and
means for providing data latched in said latch means to the corresponding said control point, and/or shifting said observation points data obtained from the corresponding said observation points into said latch means.

10. The integrated circuit device according to claim 1, wherein each of said selecting data holding means comprises
selecting data latch means for latching said selecting data, and
means for shifting said selecting data applied from a corresponding selecting data holding means of a preceding stage into said selecting data latch means.

11. The integrated circuit device according to claim 1, further comprising a plurality of operation halting means provided for each of said shift register means, each responsive to said selecting data held in the corresponding said selecting data holding means for halting the operation of the corresponding said shift register means.

12. The integrated circuit device according to claim 11, wherein each of said operation halting means halts the operation of the corresponding shift register means when a corresponding data bypass path is formed in the corresponding said shift register means by corresponding bypass means.

13. The integrated circuit device according to claim 12, wherein
each of said shift register means operates in response to each of the applied operation clock signals, and
each of said operation halting means comprises gate means for gating said operation clock signal applied to the corresponding said shift register means.

14. The integrated circuit device according to claim 13, wherein
each of said shift register means comprises a plurality of shift register latch means connected in series to each other, each coupled to a corresponding control point and/or a corresponding observation point, and
each of said gate means gates said operation clock signal applied to each of said shift register latch means of the corresponding said shift register means.

15. The integrated circuit device according to claim 1, wherein each of said bypass means comprises selecting means for selecting either of an output data or an output data of the corresponding shift register means to provide the same to the following said shift register means, according to said selecting data held in the corresponding said selecting data holding means.

16. A scan path system used in an integrated circuit device having one or more control points and one or more observation points therein, for propagating externally applied control point data to a control point, and for propagating and providing observation point data obtained from an observation point to an external source, said scan path system comprising one or more scan path circuits, each of said scan path circuit comprising
a single data input terminal for serially applying said control point data and selecting data,
a single data output terminal for serially providing said observation point data,
shift register means inserted between said data input terminal and said data output terminal, and having one or more bits, wherein all bits are coupled to a corresponding control point and/or a corresponding observation point,
selecting data holding means provided external to a data propagation path formed by said shift register means between said data input terminal and said data output terminal, for fetching and holding said selecting data applied from said data input terminal and shifted by said shift register means, from an output of an arbitrary bit of said shift register means, and
bypass means operating in response to said selecting data held in said selecting data holding means for forming a data bypass path with respect to said shift register means, when said selecting data does not select said shift register means,
said shift register means shifting said control point data applied from said data input terminal and providing the same to said control point, and fetching and shifting said observation point data from said observation point to provide to said data output terminal.

17. The scan path system according to claim 16, comprising a plurality of said scan path circuits,
said plurality of scan path circuits coupled together by coupling each of said data input terminals and each of said data output terminals in series.

18. The scan path system according to claim 17, wherein synchronizing means are provided at predetermined intervals of each of said scan path circuits, each synchronizing means synchronizing timing to output data applied from a scan path circuit of an adjacent preceding stage with the shifting operation of said shift register means in a scan path of an adjacent succeeding stage.

19. The scan path system according to claim 18, wherein each of said synchronizing means comprises a shift register having at least one bit.

20. An integrated circuit device having a plurality of control points and a plurality of observation points therein, comprising:
- a single data input terminal for serially applying selecting data and control point data to be provided to said control points,
- a single data output terminal for serially providing observation point data obtained from said observation points,
- a plurality of shift register means connected in series to each other to be inserted between said data input terminal and said data output terminal each having one or more bits, wherein all bits are coupled to said control point and/or said observation points,
- a plurality of selecting data holding means provided for each of said shift register means, for fetching and holding said selecting data applied from said data input terminal and shifted by each of said shift register means, from an arbitrary bit of a corresponding said shift register means, and
- a plurality of bypass means provided for each of said shift register means, each operating in response to said selecting data held in the corresponding said selecting data holding means, for forming a data bypass path with respect to the corresponding shift register means, when said selecting data does not select the corresponding said shift register means,
- each of said selecting data holding means is provided external to a data propagation path formed by each of said shift register means,
- said shift register means providing said control point data applied form said data input terminal to the corresponding said control point, and fetching and shifting said observation point data from a corresponding said observation point provided at said data output terminal, when selected by said selecting data.

21. The integrated circuit device according to claim 20, wherein each of said selecting data holding means is coupled to the output end of the last bit of the corresponding said shift register means, for holding selecting data shifted by each of said shift register means and output from a last bit of a corresponding said shift register means.

22. The integrated circuit device according to claim 21, further comprising a plurality of functional modules each including a predetermined logic circuit,
- wherein a control point and an observation point are provided in association with each of said functional modules.

23. The integrated circuit device according to claim 22, wherein
- test data of said functional modules is serially applied as said control point data from said data input terminal, and
- test result data of said functional modules is serially provided as said observation point data from said data output terminal.

24. The integrated circuit device according to claim 23, wherein each said bypass means forms a data bypass path with respect to a corresponding shift register means coupled to a corresponding control point and a corresponding observation point of a functional module not selected as the object of testing.

25. The integrated circuit device according to claim 24, wherein a shift register means, a selecting data holding means, and a bypass means are provided for each of said functional modules.

26. The integrated circuit device according to claim 25, wherein said functional module, said shift register means, said selecting data holding means, and said bypass means provided corresponding to said functional module are modularized as one circuit block to constitute the smallest design unit.

27. The integrated circuit device according to claim 26, wherein
- a plurality of said functional modules, a plurality of said shift register means, a plurality of said selecting data holding means, and a plurality of said bypass means provided corresponding to said plurality of said functional modules are modularized as an upper level circuit block constituting a higher hierarchical design unit, and
- said plurality of shift register means are connected in series to each other within said upper level circuit block.

28. The integrated circuit device according to claim 21, wherein each of said shift register means comprises a plurality of shift register latch means connected in series to each other, each coupled to a corresponding control point and/or a corresponding observation point.

29. The integrated circuit device according to claim 28, wherein each of said shift register latch means comprises
- latch means for latching data,
- means for shifting data applied form a shift register latch means of the preceding stage into said latch means, and
- means for providing data latched in said latch means to the corresponding said control point, and/or shifting said observation point data obtained from the corresponding said observation point into said latch means.

30. The integrated circuit device according to claim 21, wherein each of said selecting data holding means comprises
- selecting data latch means for latching said selecting data, and
- means for shifting said selecting data applied from the corresponding said shift register means into said selecting data latch means.

31. The integrated circuit device according to claim 21, further comprising a plurality of operation halting means provided for each of said shift register means, each responsive to said selecting data held in the corresponding said selecting data holding means for halting the operation of the corresponding said shift register means.

32. The integrated circuit device according to claim 31, wherein each of said operation halting means halts the operation of the corresponding shift register means when a corresponding data bypass path is formed in the corresponding said shift register means by said bypass means.

33. The integrated circuit device according to claim 32, wherein
- each of said shift register means operates in response to respective applied operation clock signals, and
- each of said operation halting means comprises gate means for gating said operation clock signal applied to the corresponding said shift register means.

34. The integrated circuit device according to claim 33, wherein
- each of said shift register means comprises a plurality of shift register latch means connected in series to each other, each coupled to a corresponding control point and/or a corresponding observation point, and each of said gate means gates an operation clock signal applied to each of said shift register latch means of the corresponding said shift register means.

35. The integrated circuit device according to claim 21, further comprising forcible disable means for forcibly disabling each of said bypass means to prevent a data bypass path from being formed in all of said shift register means, said control point data being applied from said input terminal and propagated to each of said selecting data holding means via each of said shift register means, when all of said bypass means are disabled by said forcible disable means.

36. The integrated circuit device according to claim 21, wherein each of said bypass means comprises selecting means for selecting either of the output data or input data of the corresponding shift register means to provide the same to the next said shift register means, according to said selecting data held in the corresponding said selecting data holding means.

37. The integrated circuit device according to claim 20, wherein each of said shift register means has a plurality of bis, and each of said bypass means fetches the output data of a bit of a predetermined number in order form the input end of the corresponding said shift register means to form said data bypass path with respect to a succeeding bit.

38. The integrated circuit device according to claim 37, wherein each of said bypass means comprises a bypass line for receiving the output data of a bit of a predetermined number in order from the input end of said shift register means corresponding to one end thereof, and selecting means for selecting and providing either of the output data of the last bit of the corresponding said shift register means or the data bypassed by said bypass line, according to said selecting data held in the corresponding said selecting data holding means.

39. The integrated circuit device according to claim 38, wherein each of said selecting data holding means is coupled to a corresponding said bypass line.

40. The integrated circuit device according to claim 37, further comprising forcible setting means for forcibly setting all of said selecting means so that each of said selecting means selects the output data of the corresponding said bypass line, wherein said selecting data is applied from said data input terminal and propagated to each of said selecting data holding means after all of said selecting means are forcibly set by said forcible setting means.

41. The integrated circuit device according to claim 37, wherein each of said bypass means fetches the output data of the first bit from the input end of the corresponding said shift register means to form a corresponding data bypass path with respect to the following bit.

42. The integrated circuit device according to claim 37, further comprising a plurality of functional modules each including a predetermined logic circuit, wherein a corresponding control point and a corresponding observation point are provided in association with each of said functional modules.

43. The integrated circuit device according to claim 42, wherein test data of said functional modules is serially applied as said control point data from said data input terminal, and test result data of said functional modules is serially output as said observation point data from said data output terminal.

44. The integrated circuit device according to claim 43, wherein each said bypass means forms a data bypass path with respect to a corresponding shift register means coupled to a control point and an observation point of a functional module no selected as the object of testing.

45. The integrated circuit device according to claim 44, wherein a shift register means, a selecting data holding means, and a bypass means are provided for each of said functional modules.

46. The integrated circuit device according to claim 45, wherein said functional module, said shift register means, said selecting data holding means, and said bypass means provided corresponding to said functional modules are modularized as one circuit block to constitute the smallest design unit.

47. The integrated circuit device according to claim 46, wherein a plurality of said functional modules, and a plurality of said shift register means, a plurality of said selecting data holding means, and a plurality of said bypass means provided corresponding to said plurality of functional modules are modularized as an upper level circuit block constituting a higher hierarchical design unit, and said plurality of shift register means are connected in series to each other within said upper level circuit block.

48. The integrated circuit device according to claim 37, wherein each of said shift register means comprises a plurality of shift register latch means connected in series to each other, each coupled to a corresponding control point and/or a corresponding observation point.

49. The integrated circuit device according to claim 48, wherein each of said shift register latch means comprises latch means for latching data, means for shifting data applied from said shift register latch means of the preceding stage into said latch means, and means for providing data latched in said latch means to the corresponding said control point, and/or shifting said observation point data obtained from the corresponding said observation point into said latch means.

50. The integrated circuit device according to claim 37, wherein each of said selecting data holding means comprises selecting data latch means for latching said selecting data, and means for shifting said selecting data applied from the corresponding said bypass circuit into said selecting data latch means.

51. The integrated circuit device according to claim 37, further comprises a plurality of operation halting means provided for each of said shift register means, each responsive to said selecting data held in the corresponding said selecting data holding means to halt the operation of the predetermined bit in the corresponding said shift register means.

52. The integrated circuit device according to claim 51, wherein each of said operation halting means halts the operation of said predetermined bit when said data bypass path is formed in a predetermined bit of the corresponding said shift register means by said bypass means.

53. The integrated circuit device according to claim 52, wherein each bit of each of said shift register means operates in response to the applied operation clock signals, and each of said operation halting means comprises gate means for gating said operation clock signals applied to a predetermined bit of the corresponding said shift register means.

* * * * *